(12) United States Patent
Schulz-Harder

(10) Patent No.: US 6,386,278 B1
(45) Date of Patent: May 14, 2002

(54) COOLER

(76) Inventor: Jurgen Schulz-Harder, Hugo-Dietz-Str. 32, D-91207 Lauf (DE)

( * ) Notice: Subject to any disclaimer, the term of this patent is extended or adjusted under 35 U.S.C. 154(b) by 0 days.

(21) Appl. No.: 09/361,301

(22) Filed: Jul. 27, 1999

(30) Foreign Application Priority Data

| Aug. 4, 1998 | (DE) | 198 35 126 |
| Aug. 6, 1998 | (DE) | 198 35 583 |
| Oct. 15, 1998 | (DE) | 198 47 557 |
| Nov. 21, 1998 | (DE) | 198 53 750 |
| Jun. 4, 1999 | (DE) | 199 25 510 |

(51) Int. Cl.$^7$ ............ F28F 3/08; F28F 13/00; F28F 13/08
(52) U.S. Cl. ............ 165/167; 165/146; 165/147
(58) Field of Search ............ 165/80.4, 146, 165/147, 168, 167; 361/689, 699

(56) References Cited

U.S. PATENT DOCUMENTS

| 1,958,899 | A | * | 5/1934 | MacAdams | 165/146 |
| 4,420,739 | A | * | 12/1983 | Herren | 338/53 |
| 5,002,123 | A | * | 3/1991 | Nelson et al. | 165/147 |
| 5,212,004 | A | * | 5/1993 | Bottcher et al. | 165/167 |
| 6,014,312 | A | * | 1/2000 | Harder et al. | 165/80.4 |
| 6,151,341 | A | * | 11/2000 | Bull et al. | 372/35 |
| 6,167,952 | B1 | * | 1/2001 | Downing | 165/167 |

* cited by examiner

Primary Examiner—Ira S. Lazarus
Assistant Examiner—Tho V Duong
(74) Attorney, Agent, or Firm—Hoffman, Wasson & Gitler, PC

(57) ABSTRACT

A cooler has a plurality of layers arranged in a stack and connected to one another along their surfaces. Each layer has openings allowing for three-dimensional flow of the coolant between an intake and an outlet. The flow resistance or the gradient of flow resistance increases from the intake to the outlet so that the coolant is increasingly forced to concentrate at the cooling surface as coolant flows from the intake to the outlet.

21 Claims, 26 Drawing Sheets

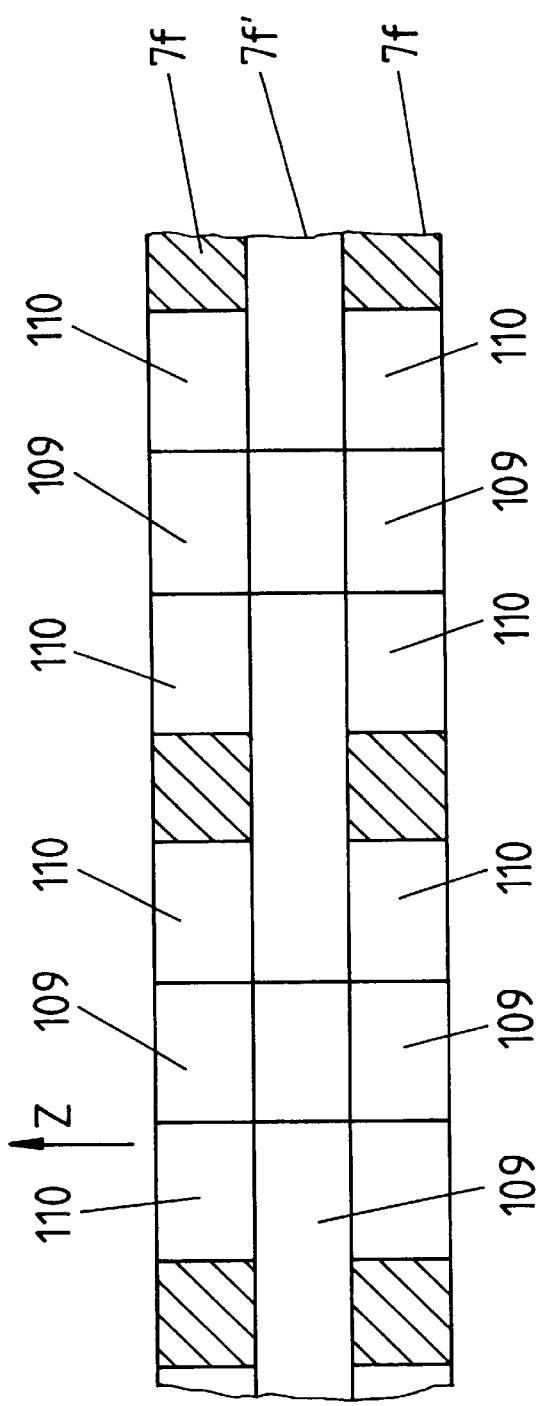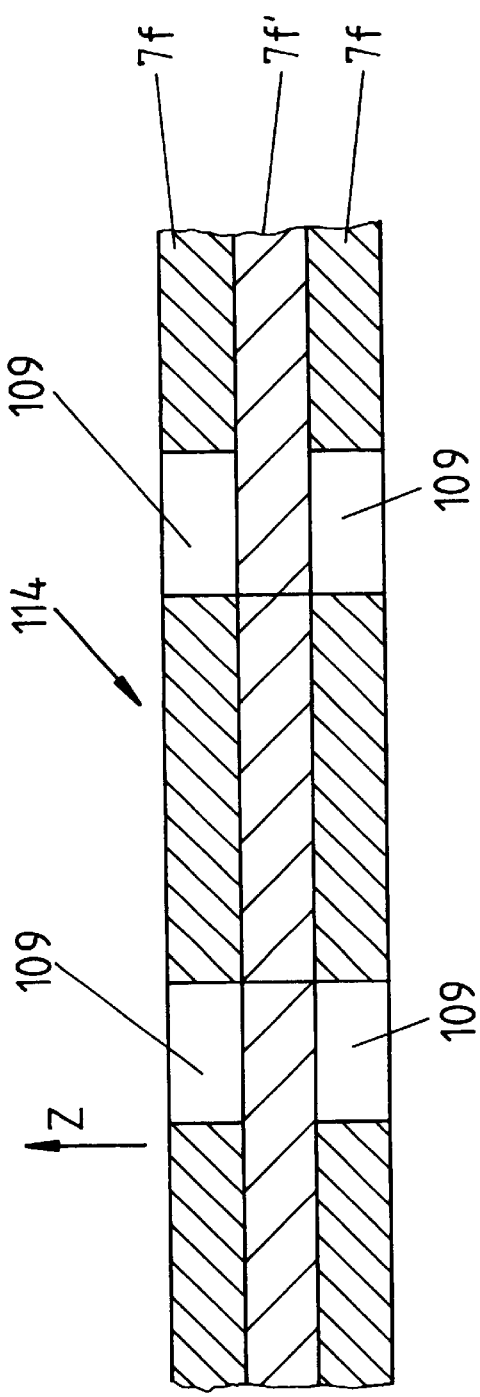

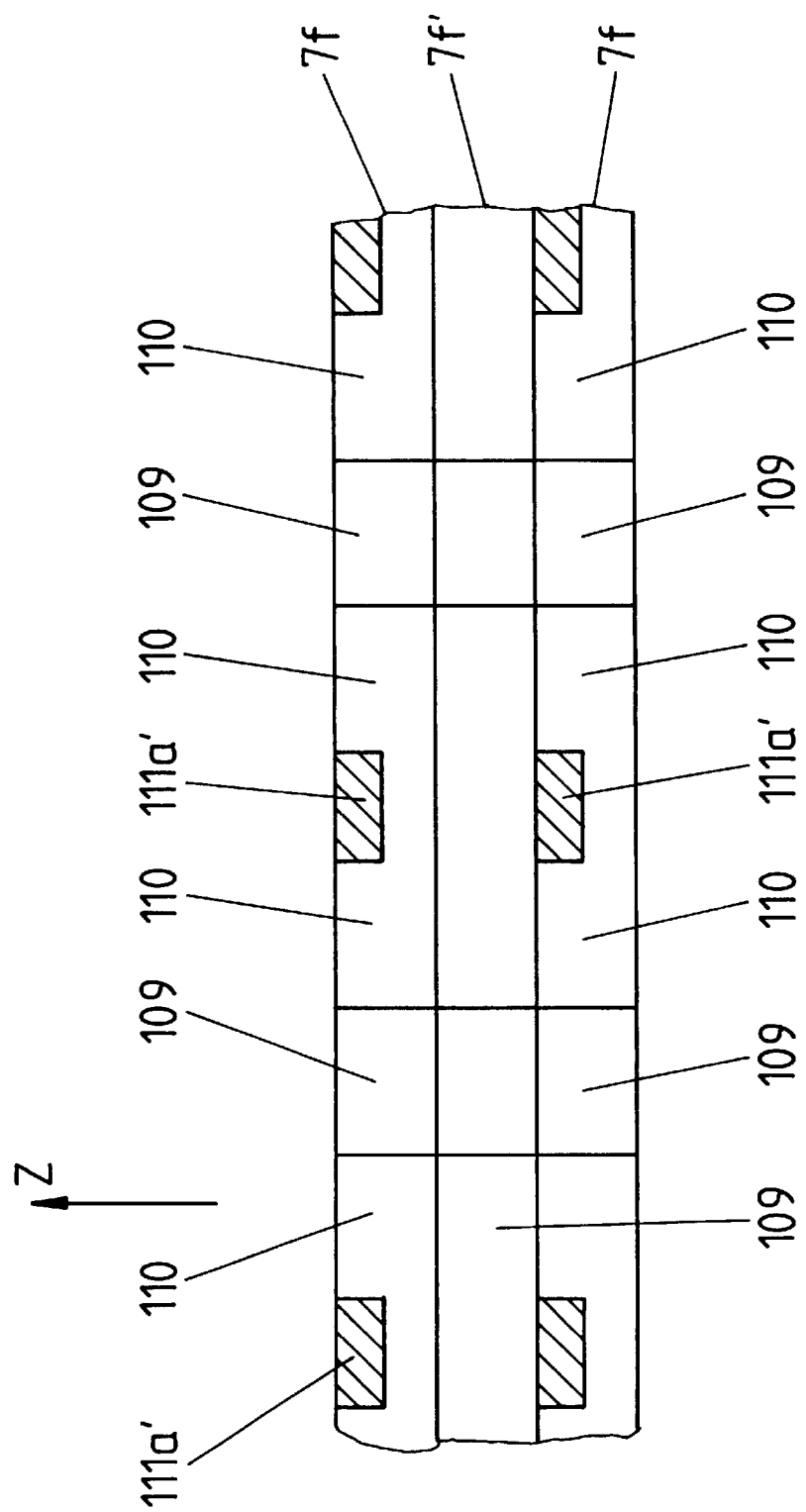

COOLER

BACKGROUND OF THE INVENTION

The invention refers to a cooler for use as a heat sink for electrical components.

Coolers of this type, which consist of a number of plies or layers arranged superimposed in a stack and are suited for use as heat sinks for electrical or electronic components, circuits or modules, are principally known. In this respect, the use of metal layers that are connected with each other by means of DCB (direct copper bonding) technology is also known (IBMTDB, 1993, vol. 36, no. 11, pp. 291–293; IBMTDB, 1992, vol. 35, no. 4A, pp. 378–379.)

In addition, a cooler has already been proposed consisting of a number of cooler layers that form a three-dimensional micro cooler structure by means of corresponding structuring, i.e. a cooler structure that can be flowed through in three spatial axes extending vertically to each other (not previously published DE 197 10 783.4). In practice, it has been proven that the cooling capacity of such a cooler can not be increased despite an increase in the number of cooling layers, i.e. those cooling layers that are at a greater distance from the at least one cooling surface no longer contribute, or contribute only insignificantly, to the cooling effect.

Attempts have been made to overcome this disadvantage by having the cooling channels of a multi-layer cooler follow one another in a cascade and be flowed through by the coolant in the reverse flow. This results, however, in very long flow routes and therefore a higher flow resistance for the coolant through the cooler.

The purpose of the invention is to provide a cooler that enables an improved cooling capacity.

SUMMARY OF THE INVENTION

In order to solve this problem, a cooler for use as a heat sink for electrical or electronic components is disclosed. The cooler according to the invention can be manufactured easily and cheaply from several cooler layers stacked superimposed and connected with each other by means of a suitable method such as soldering, active soldering or DCB (direct copper bonding) technique etc.

According to one aspect of the invention, appropriate structuring of the first and/or second layer accomplishes that even with a number of layers, the coolant, which at first is flowing at the intake in areas of the cooler structure at a greater distance from the at least one cooling surface or at least a considerable portion of the coolant, is directed to or in the vicinity of the cooling surface and there contributes to or supplies the cooling effect.

According to another aspect of the invention, a reduction of the overall flow resistance is obtained by enlargement of the passages at the intersections of the structures. At the same differential pressure on the cooler, a higher coolant flow rate and therefore an increase in the cooling effect is achieved.

BRIEF DESCRIPTION OF THE FIGURES

In the following, the invention is explained in more detail using embodiment examples with reference to the figures, which illustrate:

FIG. 24 illustrates a cross-section corresponding to the line I—I of FIG. 22 through this first metal layer and metal layers in the cooler below of the cooler of FIG. 21;

FIG. 25 illustrates a cross-section corresponding to the line II—II of FIG. 22 through the first metal layer and metal layers below of the cooler of FIG. 21;

FIG. 26 illustrates a cross-section similar to FIG. 24 in a further possible embodiment;

DETAILED DESCRIPTION OF THE INVENTION

The cooler (heat sink) designated in general as 1 serves to draw off dissipated heat (power loss) of an electric or electronic part or component, for example of a semiconductor power component or module. This electric or electronic component is designated in general as 2 in FIG. 1.

Figure 1:
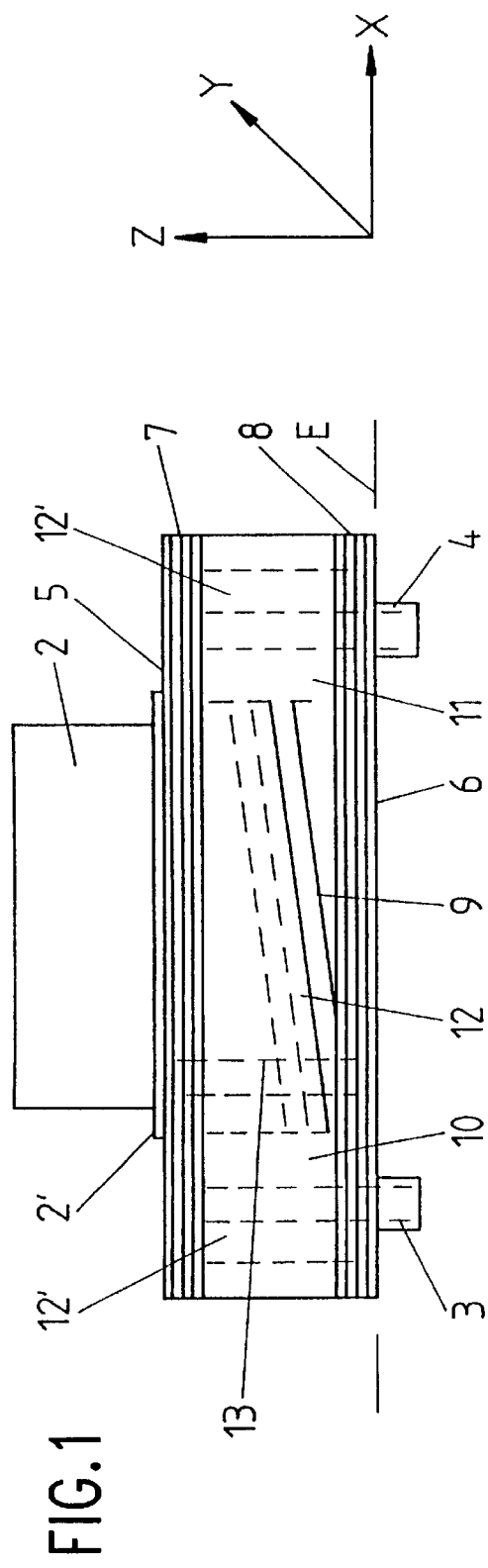
FIG. 1 illustrates in a very simplified depiction, and in side view, a three-dimensional micro cooler according to invention.

The cooler 1 is constructed in multiple layers in a manner generally known, i.e. it consists of several cooler layers, e.g. metal layers, for example copper layers, that are arranged superimposed in a stack and are connected with each other on the surface to the cooler 1 which is cube-shaped on the outer surfaces. In FIG. 1, there is in addition an inlet for a coolant, preferably for a liquid coolant, for example water, designated as 3. The outlet at which the coolant or heat-transferring medium leaves the cooler 1 is designated as 4.

For the sake of simplification, the three spatial axes extending vertically to each other, X-axis, Y-axis and Z-axis, are shown in the figures. The X-axis, Y-axis and Z-axis are assumed to be such that the upper and lower sides of cooler 1, both in the X-Y plane and that the individual metal layers, which form the cooler, are also arranged in the X-Y plane, and follow each other in the direction of the Y-axis. The plane of the bottom side of the cooler 1 is designated in FIG. 1 as E. The X-Y plane of the bottom side of the cooler 1 is designated in FIG. 1 as E.

In the interior of the cooler 1 formed by the metal layers there are flow channels between the intake 3 and the outlet 4, formed by a structuring of the individual metal layers described in more detail below, on which (channels) the fluid can flow through the interior of the cooler 1 or a cooler structure 12, continuously branching out three-dimensionally, i.e. by multiple deviation in all three spatial axes X-axis, Y-axis and Z-axis.

In practice it has been shown that in an embodiment of a cooler that consists of several structured metal layers, for example of structured copper layers that for example have a thickness on the order of 0.3 mm, the cooling effect cannot be improved by increasing the number of metal layers indefinitely and therefore by increasing the height of the cooler 1 in the Y-axis. Rather, an improvement of the cooing effect is no longer achieved after a certain number of layers, for example with the above-mentioned thickness of the metal layers already after more than five layers, since the lower metal layers closer to the bottom or plane E or the flow channels formed there by the structuring can no longer contribute to the cooling effect.

According to the invention, therefore, the structuring of the individual metal layers 7 and 8 forming the cooler 1 is such that at least in the lower area of the cooler 1 the metal layers 8 are structured in a form that the flow diameter at least in the planes of these layers, i.e. in the X-axis and Y-axis and therefore the specific flow resistance, i.e. the resistance with reference to the length or per length and diameter of the flow channel, increases from the intake 3 to the outlet 4.

Therefore, the cooler 1 consists specifically of an upper metal end layer 5 that is essentially closed and on which, in the depicted embodiment, the component 2 is fastened, preferably by means of an intermediate layer 2' made of an insulating material, for example by means of a ceramic layer, of a lower closed metal end layer 6 that forms the bottom and in which the connections for inlet 3 and outlet 4 are provided for, and of a number of structured metal layers 7 or 8, of which the upper ones, i.e. the metal layers closer to the upper end layer 5 according to the present invention are first metal layers with non-reduced flow diameter and of which the metal layers 8, which are closer to the plane E, are according to the invention second metal layers with a specific flow resistance that increases toward the outlet 4 at least in the X-axis and Y-axis.

It was also assumed above that the cooler 1 is formed only by the first layers 7 in the upper area, i.e. near the upper end layer and in the lower area, i.e. in the vicinity of the plane E only by the layers 8. Principally there is also the possibility to construct the cooler 1 in such a way that an increasing number of second layers 8 is inserted with increasing distance from the upper end layer 5 between first layers 7; i.e. first and second layers alternate in the middle between the end layers 5 and 6, for example, whereby the proportion of second layers 8 increases with increasing distance form the upper end layer 5.

This construction results in the dispersion of the coolant within the cooler 1, shown in FIG. 1 with the lines 9, i.e. that coolant which flowed near the inlet 3 in the flow channels formed by the second layers 8 or the structuring of these in the vicinity of the plane E, is displaced increasingly into the upper layers 7 adjacent to the top of the cooler 1 or the top end layer 5, for an improved lateral distribution of the coolant.

For the sake of simplicity, it was assumed above that the first metal layers 7 that are connected to each other and also the second metal layers 8 that are connected to each other both have an identical structure. In fact, this is as a rule not the case in practice, i.e. two metal layers 7 that are connected to each other, but also two metal layers 8 that are connected to each other are differently structured such that the structures of these metal layers are not congruent, but rather for example are offset against each other around a partial grid of such a structure, that for example a closed surface segment of an adjacent layer 7 or 8 is situated at least partially opposite of a hole or opening formed in a metal layer 7 or 8, so as not to result in any direct uninterrupted straight flow channels in the direction of the Z-axis; rather, the flow in this direction is possible only by means of several deviations in the X-axis and/or Y-axis. The layers 7 or 8 are for example structured in such a way that the structure at least for the area forming the cooler structure 12 with the micro channels is symmetrical to a symmetry axis extending in the direction of the X-axis and/or Y-axis.

It was also assumed above that the cooler 1 is formed only by the first layers 7 in the upper area, i.e. near the upper end layer and in the lower area, i.e. in the vicinity of the plane E only by the layers 8. Principally there is also the possibility to construct the cooler 1 in such a way that an increasing number of second layers 8 is inserted with increasing distance from the upper end layer 5 between first layers 7; i.e. first and second layers alternate in the middle between the end layers 5 and 7, for example, whereby the proportion of second layers 8 increases with increasing distance form the upper end layer 5.

The individual layers 7 and 8, are structured in such a way that uninterrupted posts 13 are formed in the interior of the cooler 1, especially also in the cooler structure 12, by means of closed areas or islands of the individual layers 7 and 8, which (closed areas) are congruent with each other and are connected with each other to these posts extending in the direction of the Z-axis and reaching into the outer layers 5 and 6. These uninterrupted posts 13, around which the coolant flows in all three spatial axes, lead to, among other things, short cooling routes or ways with low heat resistance between the top of the cooler 1 and the lower structures. These posts 13 also serve to absorb the pressure of the coolant and the forces resulting from this.

As is also suggested in FIG. 1, the intake 3 leads into an intake distribution chamber 10 formed by corresponding structuring of the metal layers. The outlet 4 is likewise connected with an outlet collection chamber 11 formed by corresponding structuring of the metal layers. Between these chambers 10 and 11 the cooler structure or micro structure 12 is formed by the structuring of the individual metal layers. Between the intake 3 and the respective chamber 10 and the outlet 4 and the respective chamber 11, distribution structures 12' can also be formed by means of the structuring of the metal layers 7 and 8, which likewise possess the branching flow routes and the posts 13.

As indicated by arrow A, the coolant in the cooler 1 is supplied via the intake 3 or via the chamber 10 there with excess pressure. Corresponding to arrow B, the coolant leaves the cooler after flowing through the micro structure 12 and collection in the outlet chamber 11 at the outlet 4.

In the following, the invention will be described using various examples of structured first and second metal layers that are designated with the further index or suffix a–d in the following figures in order to differentiate between the various constructions.

Figure 2:
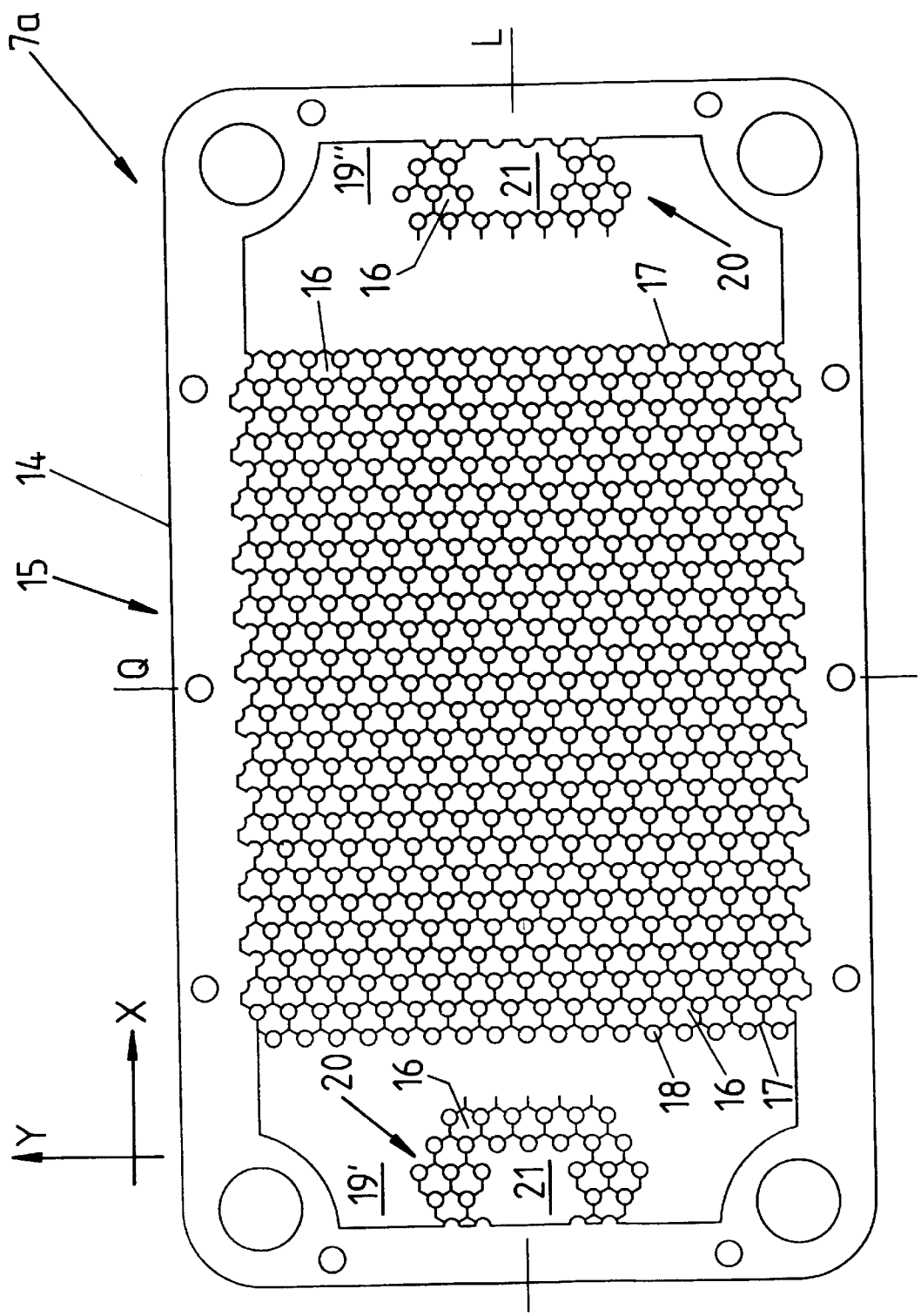
FIG. 2 illustrates in top view, one of the normally structured or first metal layers without reduced effective flow diameter for manufacture of the three-dimensional micro cooler of FIG. 1.

FIG. 2 shows in top view a first metal layer 7a that is formed from a thin metal plate, for example copper plate (copper foil) with a rectangular pattern. FIG. 2 shows the middle longitudinal axis L extending in the direction of the X-axis of the metal layer 7a and the X-axis and the Y-axis.

The metal layer 7a is provided with a number of sieve-like passages or openings 16 within a closed edge area 14 in the middle area, designated in FIG. 2 in general as 15, that have a hexagonal shape and are interconnected similar to a honeycomb structure. These openings 16 are formed by stays 17 that interconnect in a net-like structure and that enclose each opening 16 in the form of a hexagonal ring structure. On the two edges of the area 15 extending in the direction of the Y-axis these ring structures are only partially executed.

On three corners of each hexagonal ring structure of each opening 16, the stays 17 form islands 18 with enlarged surfaces. In the depicted embodiment these islands 18 are circular in shape. The islands 18 can also have another form. The islands 18 are distributed in such a way that on each opening 16 in the direction of the X-axis a corner with an island follows a corner without such an island and also the centers of the islands 18 form the imaginary corner points of an equilateral triangle, whereby one median lies between two adjacent sides of the triangle in the X-axis. Furthermore, the structuring is chosen in such a way that two stays 17 of each opening 16 lie in the direction of the X-axis and in the direction of the X-axis an island 18 is followed by an opening 16, a corner point of the ring structure without an island, a stay 17 extending in the direction of the X-axis and then a new island 18 etc.

Furthermore, the structuring of the metal layer 7a is not fully symmetrical to the middle lateral axis Q extending in the direction of the Y-axis, but rather the openings 16 are offset in relation to this lateral axis Q in such a way that the latter does not intersect the stays 17 extending in the direction of the X-axis, but rather the islands 18.

As shown in FIG. 2, the metal layer 7a is structured on the two ends, which are distanced from each other in the direction of the X-axis and are provided on both sides of area 15, in such a way that a larger opening 19' or 19" is formed at the respective end, into which a partial area 20, which corresponds to area 15 and in which a larger opening 21 is formed, extends from the part of the edge 14 extending in the direction of the Y-axis. Especially with respect to the openings 19', 19" and 21 the metal layer 7a is symmetrical to both the middle longitudinal axis L and the lateral axis Q. With metal layers 7a connected with each other to the cooler 1, the openings 19' and 19" form the chambers 10 and 11. The concurrent openings 21 form the intake 3 and outlet 4, which then are connected with the respective chamber 10 and 11 by means of the distributor structures 12' formed by the areas 20. The distributor structures 12' have the advantage that the uninterrupted posts described above and extending in the direction of the Z-axis are also present at the distributor structures 12'. Furthermore, the distributor structures 12' in particular also effect a distribution of the coolant upon emission into the chamber 10 or upon emission from the chamber 11 into the outlet 4.

By means of the distributor structures and the posts 13 it is also possible to construct the chambers 10 and 11 with a large diameter for optimal distribution of the coolant especially in the X-Y plane.

Figure 3:
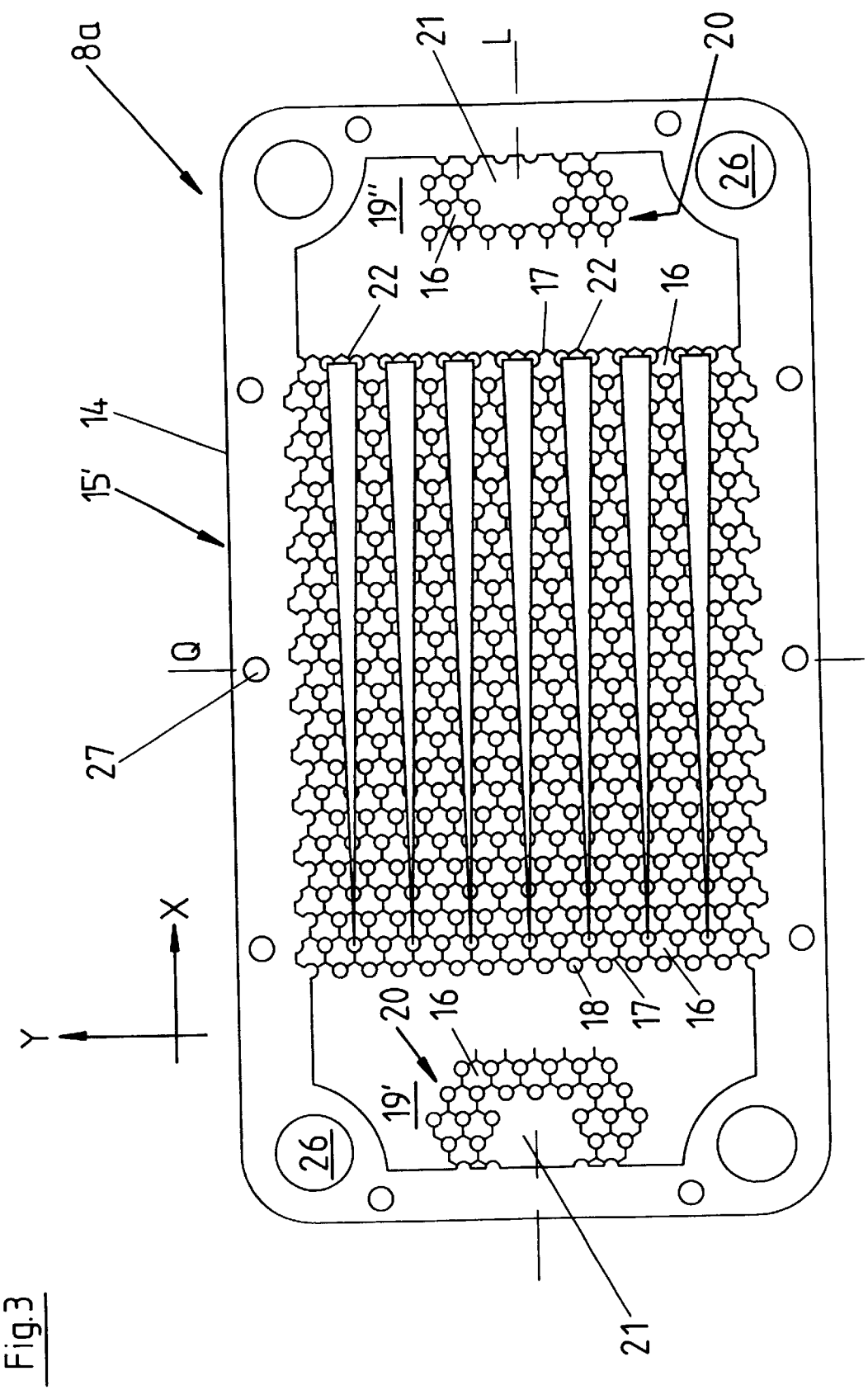
FIG. 3 illustrates in top view, one of the structured second metal layers with reduced diameter for manufacture of the three-dimensional micro cooler of FIG. 1.

FIG. 3 shows the second structured metal layer 8a, which is suitable for use with the metal layer 7a. The metal layer 8a differs essentially from the metal layer 7a only in that in the structured area 15' of the structure there, a second structure is superimposed, in the form that the relationship between the open and closed surface in the direction of the X-axis decreases from the opening 19' toward the opening 19". To achieve this the area 15' is structured in such a way that several material stays 22 are provided for that extend in the direction of the X-axis and widen in a wedge-shape toward the opening 19", and through which some of the openings 16 of the structured area 15' starting from the opening 19' toward opening 19" become increasingly closed. These material stays 22 are symmetrical to their longitudinal axis extending in the direction of the X-axis and possess a width on the edge of the structured area 15' adjacent to the opening 19" that corresponds to the middle distance of two consecutive islands 18 in the direction of the Y-axis. Also the distance between two stays 22 on this edge is the same as the axis distance of two islands. Each stay 22 lies parallel to the stays 17 extending in the direction of the X-axis and have the same axis as some of these stays.

In the embodiment depicted in FIG. 3 the arrangement of the ring structures surrounding the openings 26, i.e. of the stays 17 and islands 18 in the structured area 15' in relation to the longitudinal axis L and the lateral axis Q, corresponds to the arrangement described above for the structured area 15 of the metal layer 7a.

The stays 22 result in a decreasing flow diameter in the direction of the X-axis or an increasing specific flow resistance in the direction of the X-axis in the areas of the cooler structure 12 formed by the metal layers 8a, so that the coolant is increasingly concentrated on the top formed by the upper end layer 5 corresponding to the lines 9 of FIG. 1, thus increasing the cooling effect.

The metal layers 7a or 8a are also symmetrical to the longitudinal axis L. This means that for the manufacture of the cooler 1, in addition to metal layers 7a or 8a of the type illustrated in FIGS. 2 and 3, it is also necessary to have modified metal layers 7a or 8a that correspond to the structuring in FIGS. 2 and 3, but in which the middle structure 15 or 15' is offset by the length of a stay 17 in the direction of the X-axis In the cooler 1, then, each metal layer 7a or 8a is adjacent to such a modified metal layer.

Figure 4:
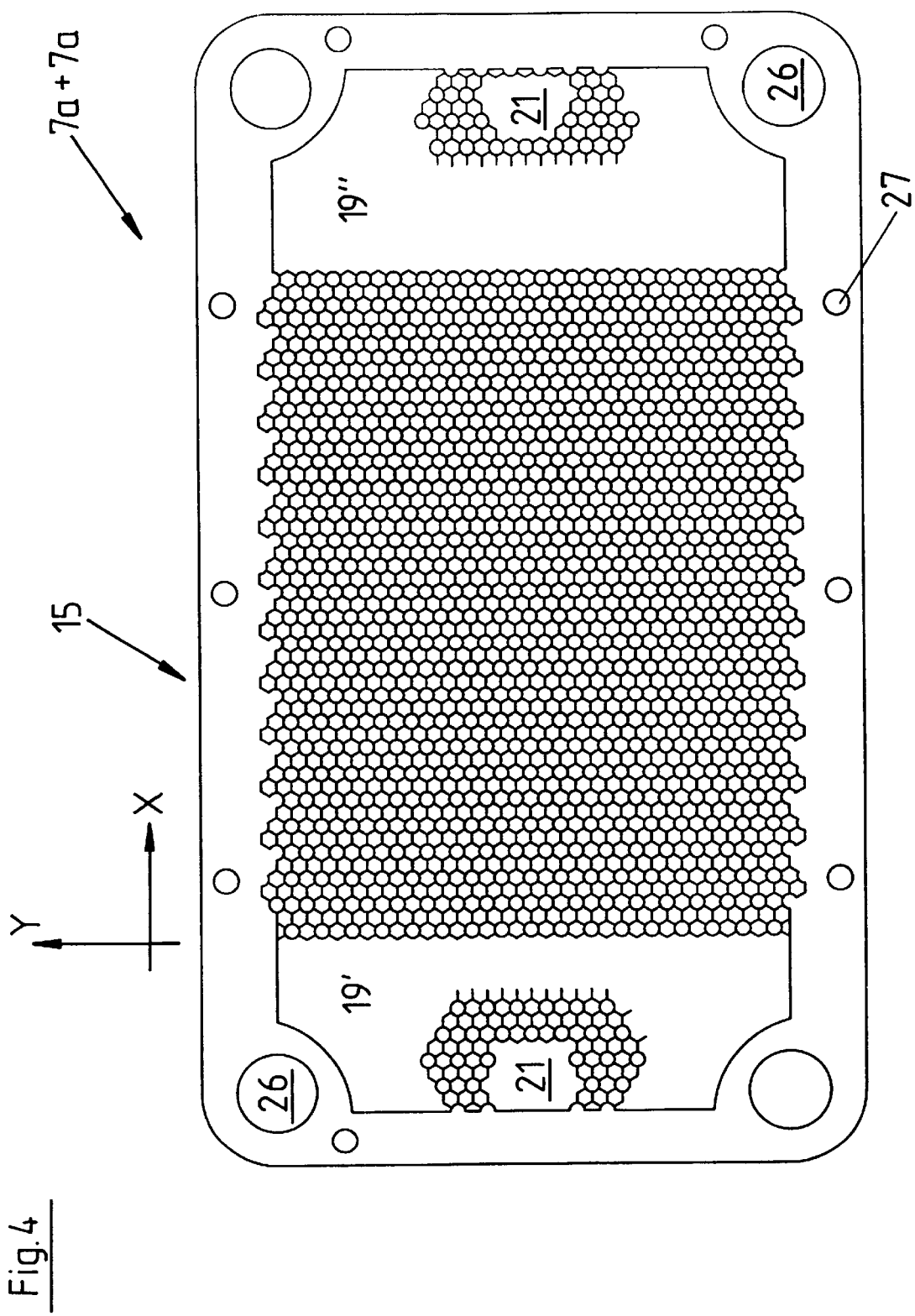
FIG. 4 illustrates in top view, two adjacent first metal layers of FIG. 2.
Figure 5:
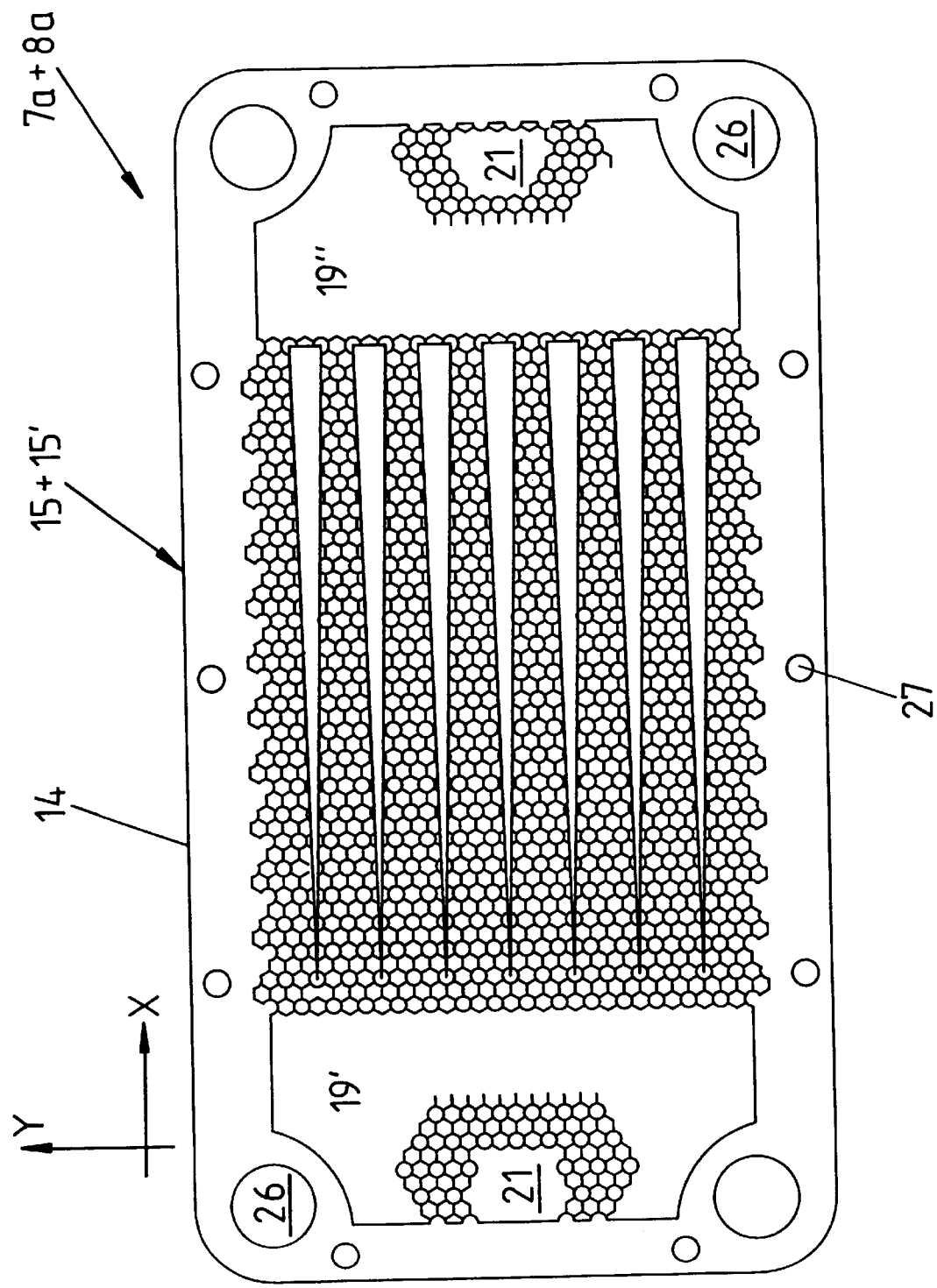
FIG. 5 illustrates in top view, two adjacent first and second metal layers of FIGS. 2 and 3.

FIG. 4 shows the structure formed in the cooler 1 by alternating non-modified and modified metal layers 7a. FIG. 5 shows the structure formed in the cooler 1 by two consecutive metal layers 7a and 8a.

Figure 6:
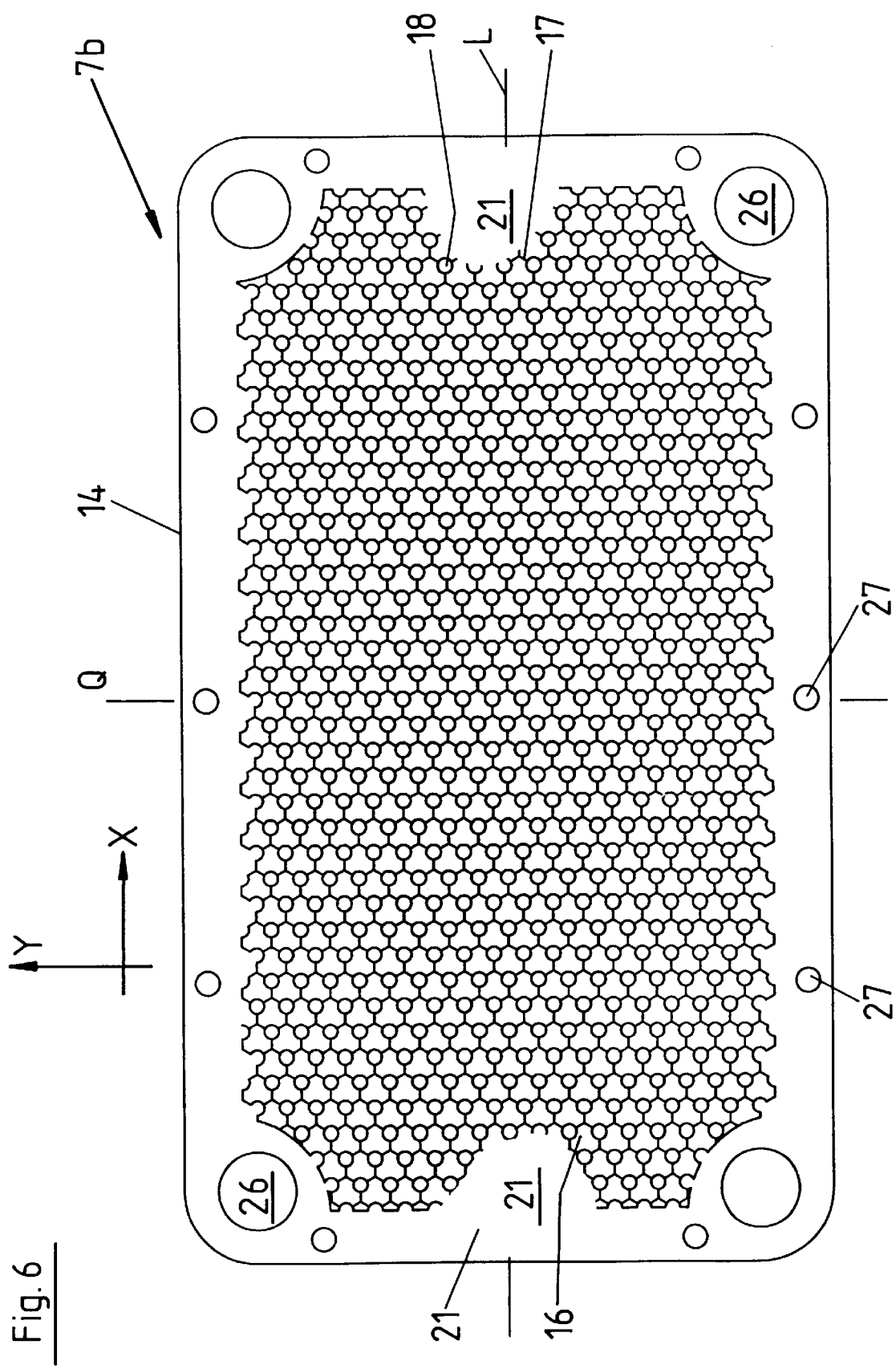
FIG. 6 illustrates in top view, structured first and second metal layers for a micro cooler.

FIG. 6 shows, as a further possible embodiment, a metal layer 7b that differs from the metal layer 7a only in that the structured area possessing the openings 16 extends on the entire area enclosed by the closed edge area 14, i.e. the openings 19' and 19" are not provided for, but only the openings 21.

Figure 7:
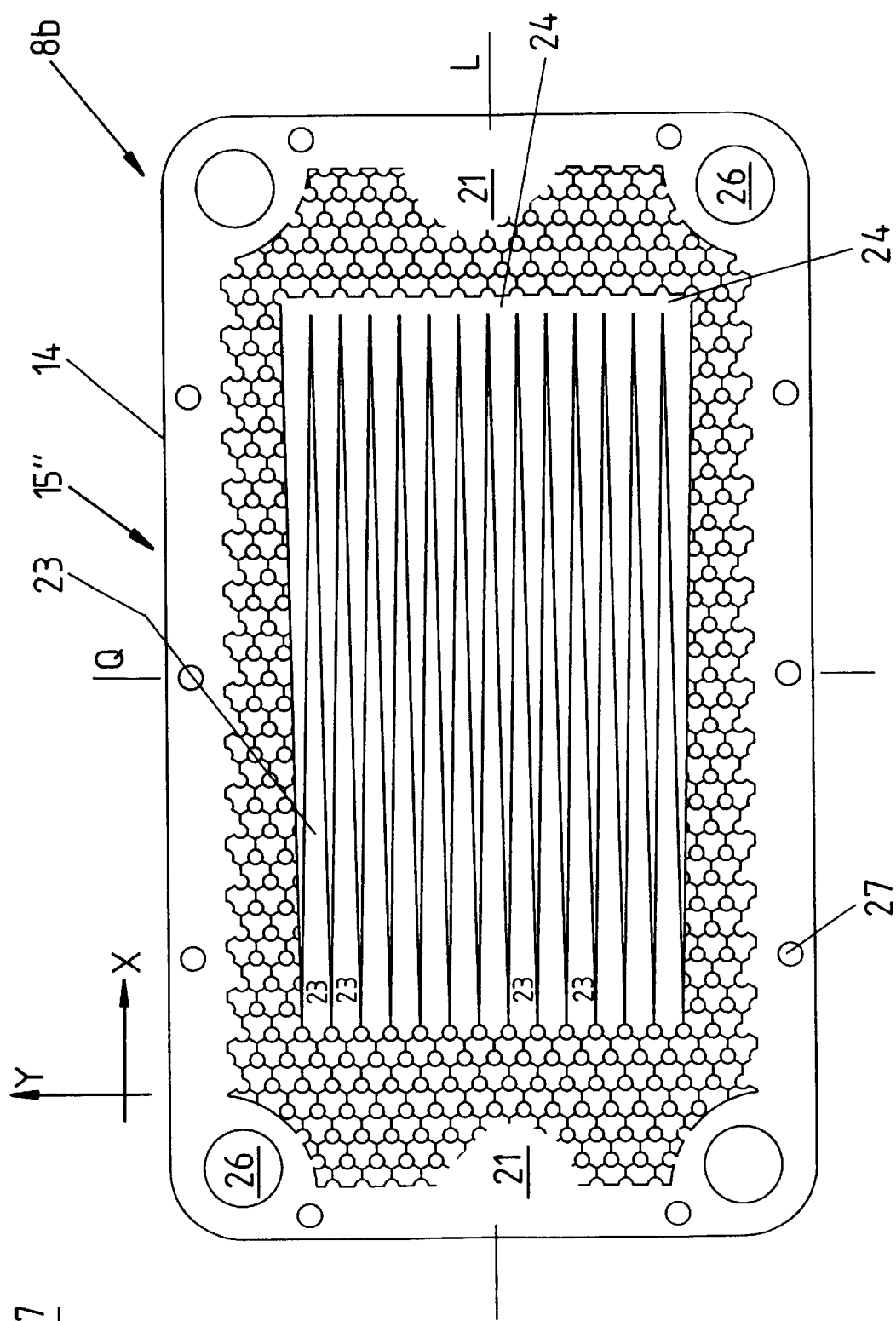
FIG. 7 illustrates in top view, two adjacent first metal layers of FIG. 6.

FIG. 7 shows a metal layer 8b that is suitable for the metal layer 7b and that differs from the metal layer 7b in that in the central area, i.e. between the two openings 21, a structured area 15" is provided for that has several narrowing, slotted wedge-shaped openings 23 extending in the direction of the X-axis, which (openings) in the embodiment of FIG. 7 are limited at one end by stays 17 of the ring structures there and at the other tapered end by a material stay 24 extending in the direction of the Y-axis.

Figure 8:
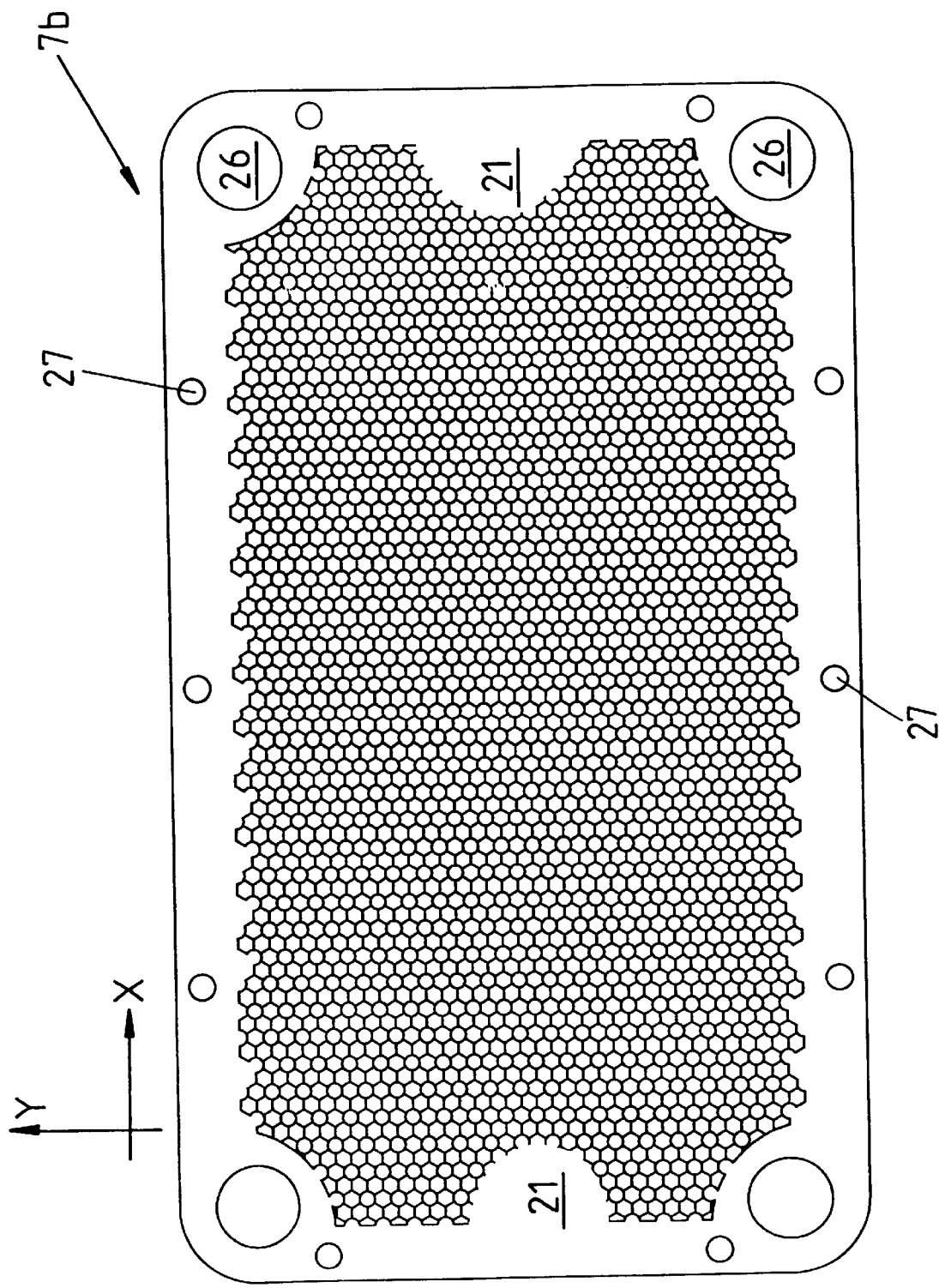
FIG. 8 illustrates in top view, two adjacent first and second metal layers of FIGS. 6 and 7.
Figure 9:
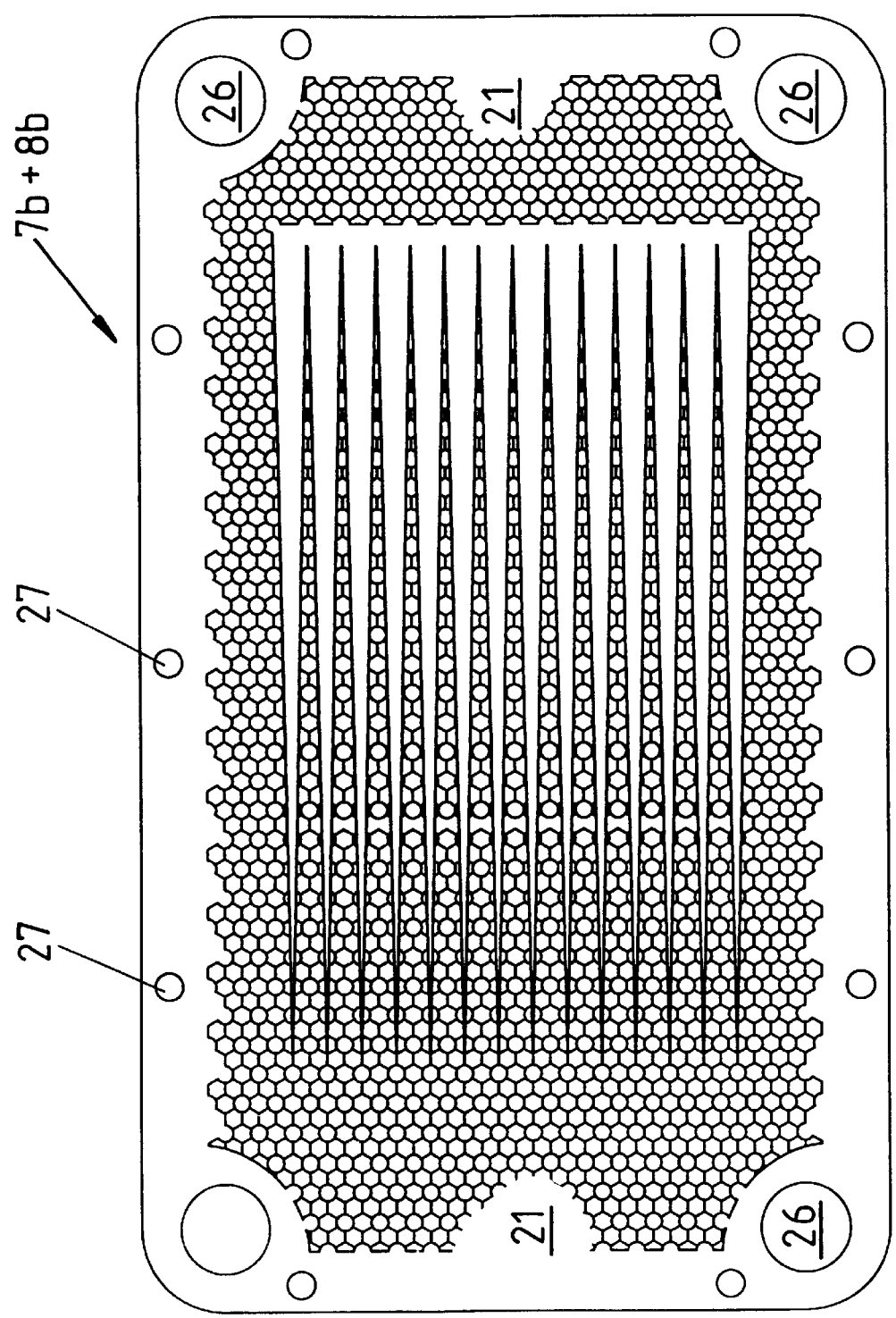

FIGS. 8 and 9 show the structure formed by two superimposed, or in the case of cooler 1, adjacent non-modified and modified metal layers 7b (FIG. 8) or by two adjacent metal layers 7b and 8b (FIG. 9).

Figure 10:
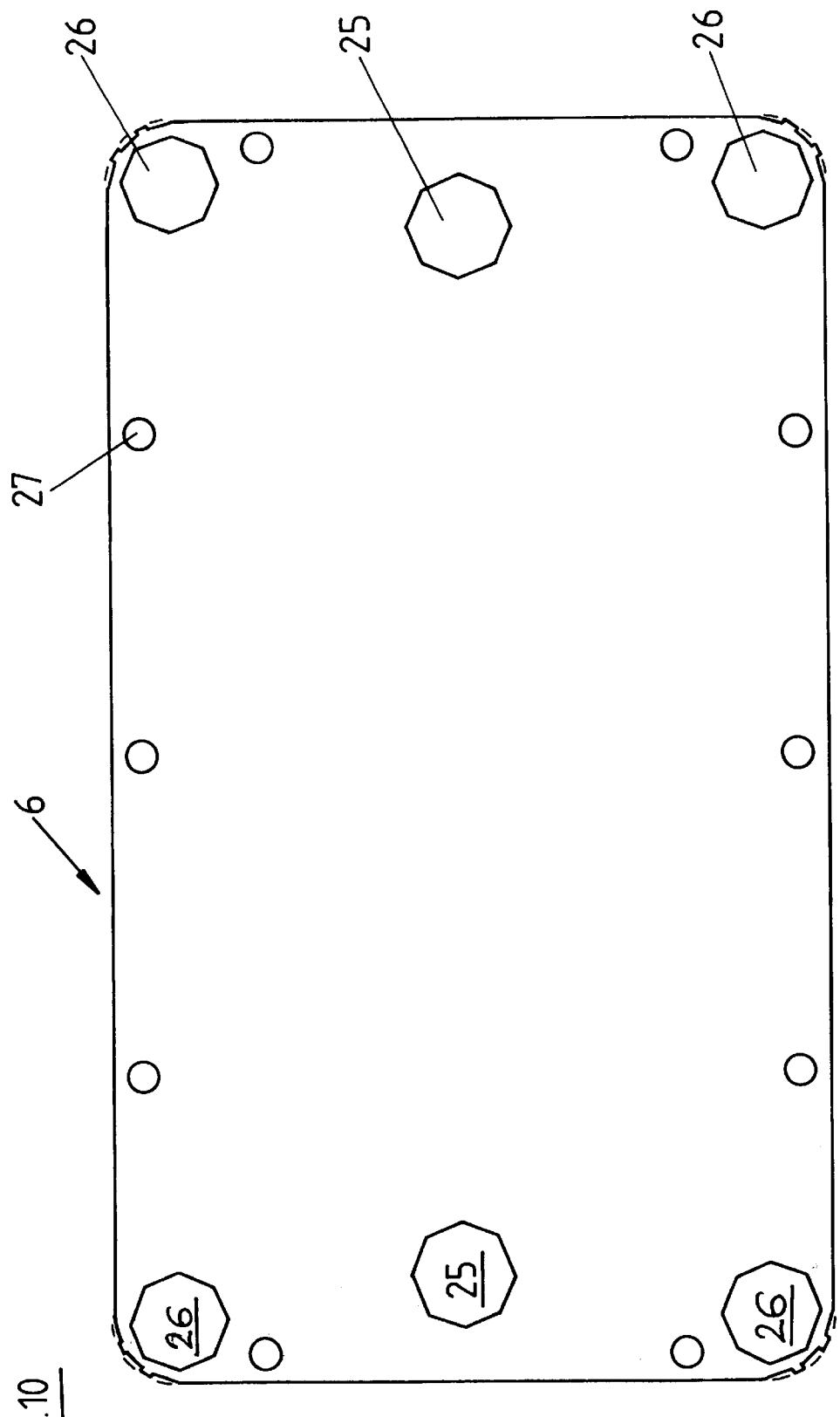
FIG. 10 and FIG. 11 illustrate the bottom or top outer end layer of a micro cooler manufactured using the structured metal layers of FIGS. 2/3 and 6/7.
Figure 11:
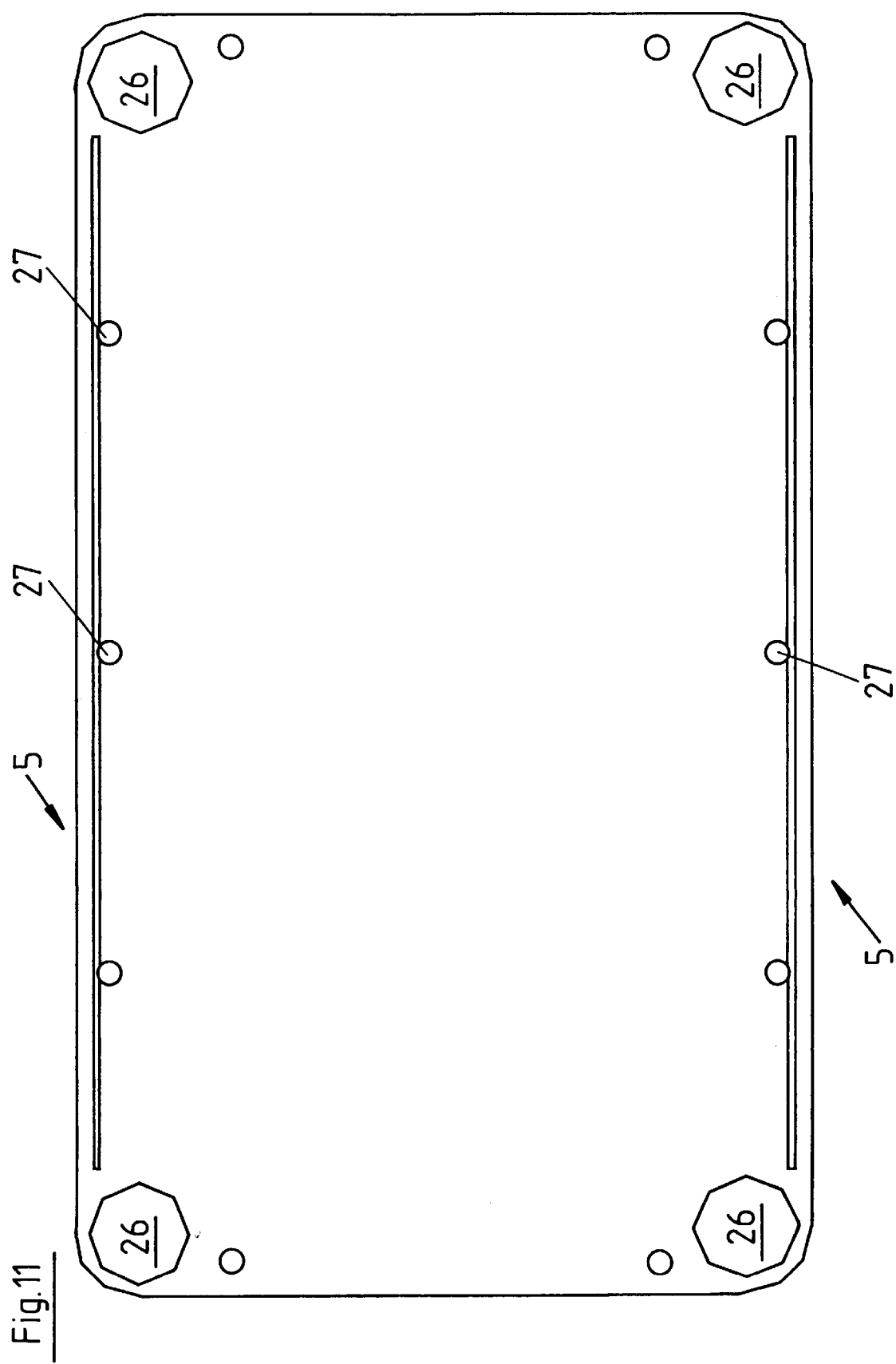

FIGS. 10 and 11 show again in individual depiction and in top view the lower end layer 6 (FIG. 10) or the upper end layer 5 (FIG. 11). Both metal layers are formed from a rectangular metal plate (e.g. copper foil). In the lower end layer 6 there are two openings 25 for the two connections 3 and 4.

As shown additionally in FIGS. 2–11, all metal layers are provided with openings 26 on their corners and with openings 27 on their surfaces. These openings 26 and 27, after stacking of the various metal layers to form the cooler 1, form uninterrupted centering and fastening passages, that for example for the manufacture of the cooler 1, i.e. for connection of the individual metal layers 5–7 to the cooler, can be used for centering and/or temporarily holding the layers together. The passages formed by the openings 26 serve also for fastening of cooler 1 in the use of this embodiment.

Figure 12:
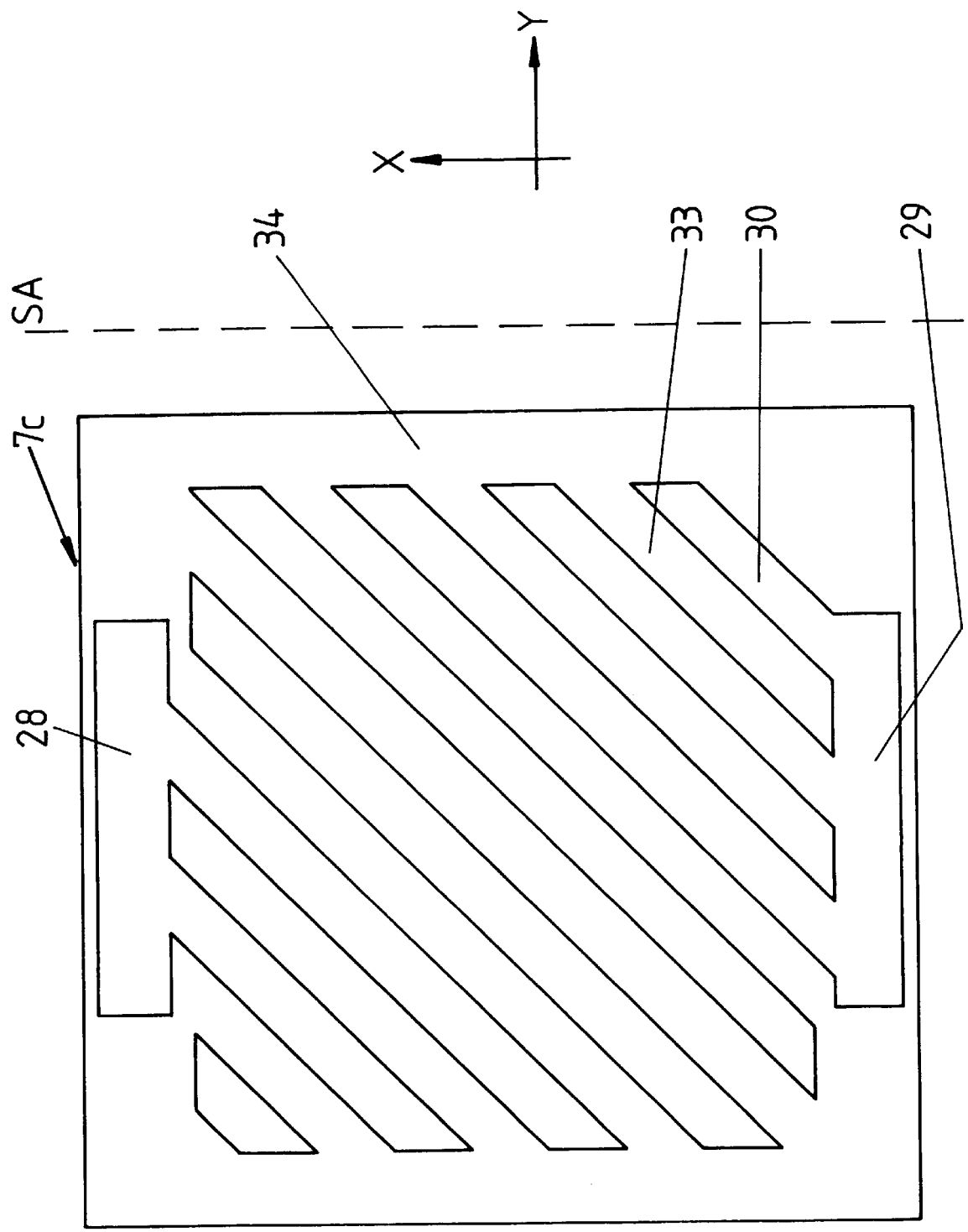
FIGS. 12–15 illustrate in simplified depiction and in top view, first and second structured metal layers for a further possible embodiment of a micro cooler.
Figure 13:
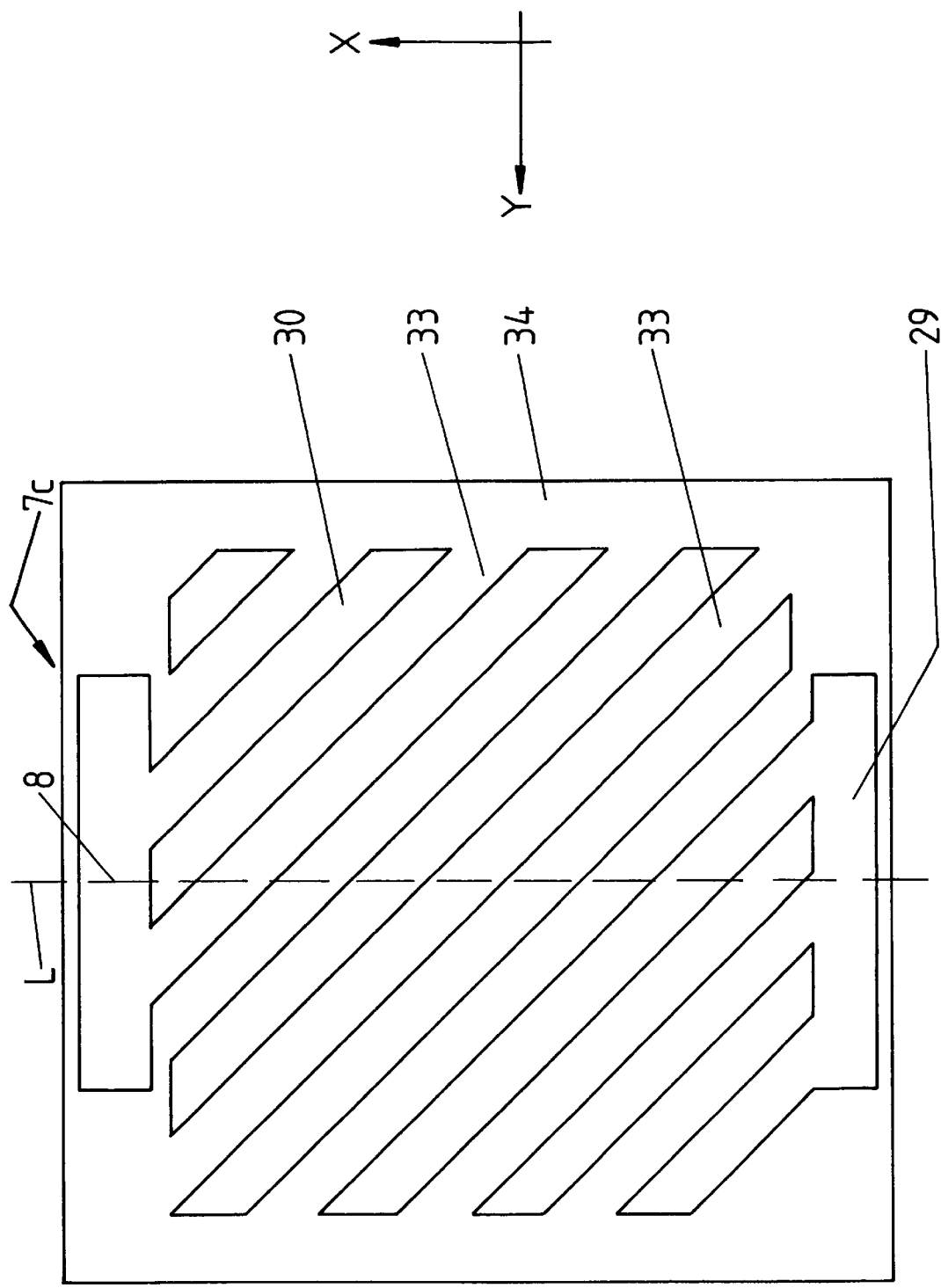

FIGS. 12 and 13 show as a further embodiment one first layer 7c in non-modified form (FIG. 12) as well as in modified form (FIG. 13), which are used in the cooler 1 connected directly to one another and in principal have the same structure, only that the modified metal layer 7c of FIG. 13 is mirror-inverted to the non-modified layer 7c of FIG. 12, mirrored on a mirror axis extending in the X-axis and designated in FIG. 12 as SA.

The metal layer 7c has a square pattern and is provided in the area of its two sides extending in the direction of the Y-axis with a rectangular opening 28 or 29 that lies in the Y-axis with its long side. The openings 28 and 29 are at a distance from one another in the X-axis. Furthermore, the metal layer 7c has a number of slotted openings 30 the long side of which intersects the middle longitudinal axis L extending in the direction of the X-axis at an angle that is smaller than 90°, whereby in the depicted embodiment this angle is 45°.

Figure 14:
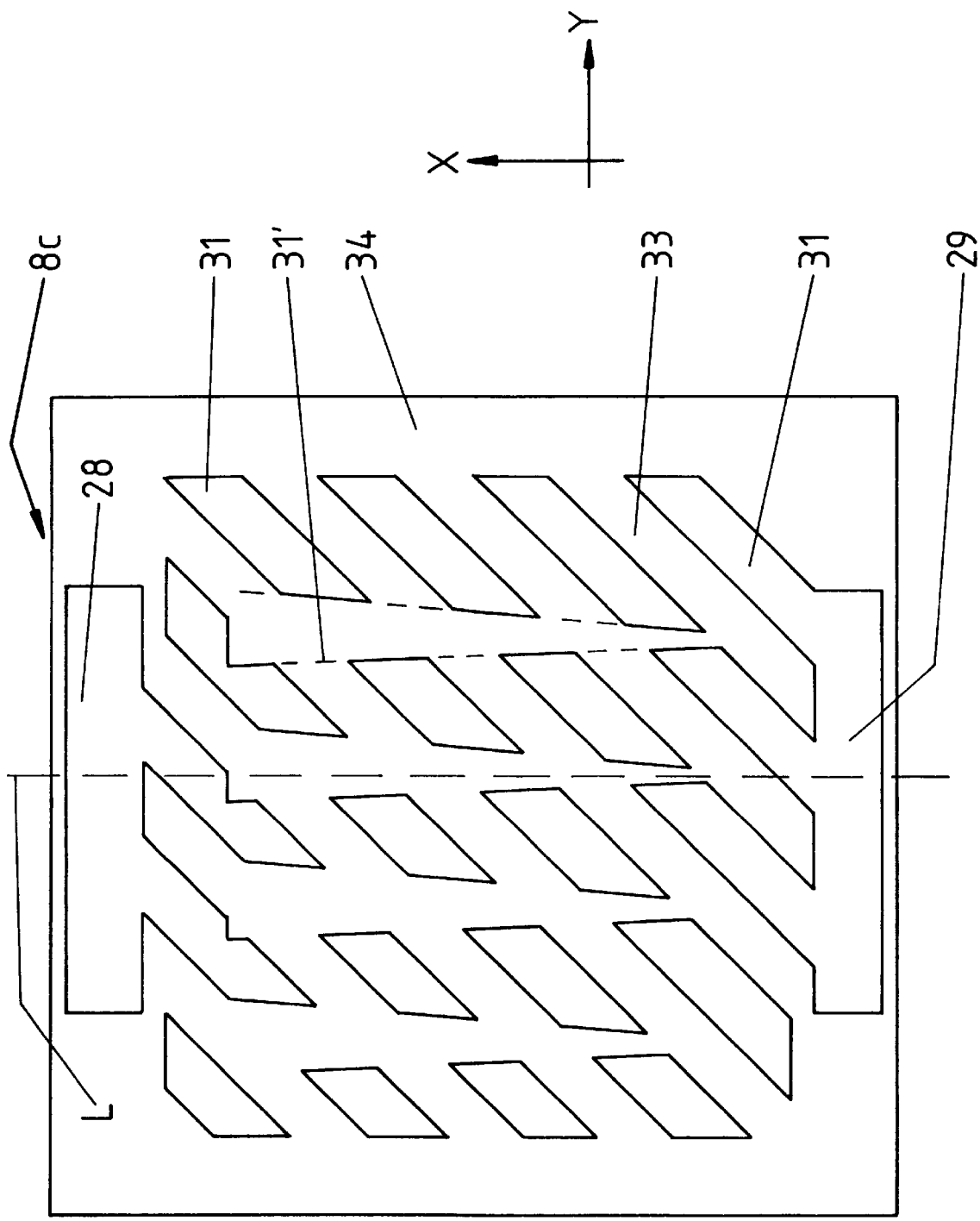
Figure 15:
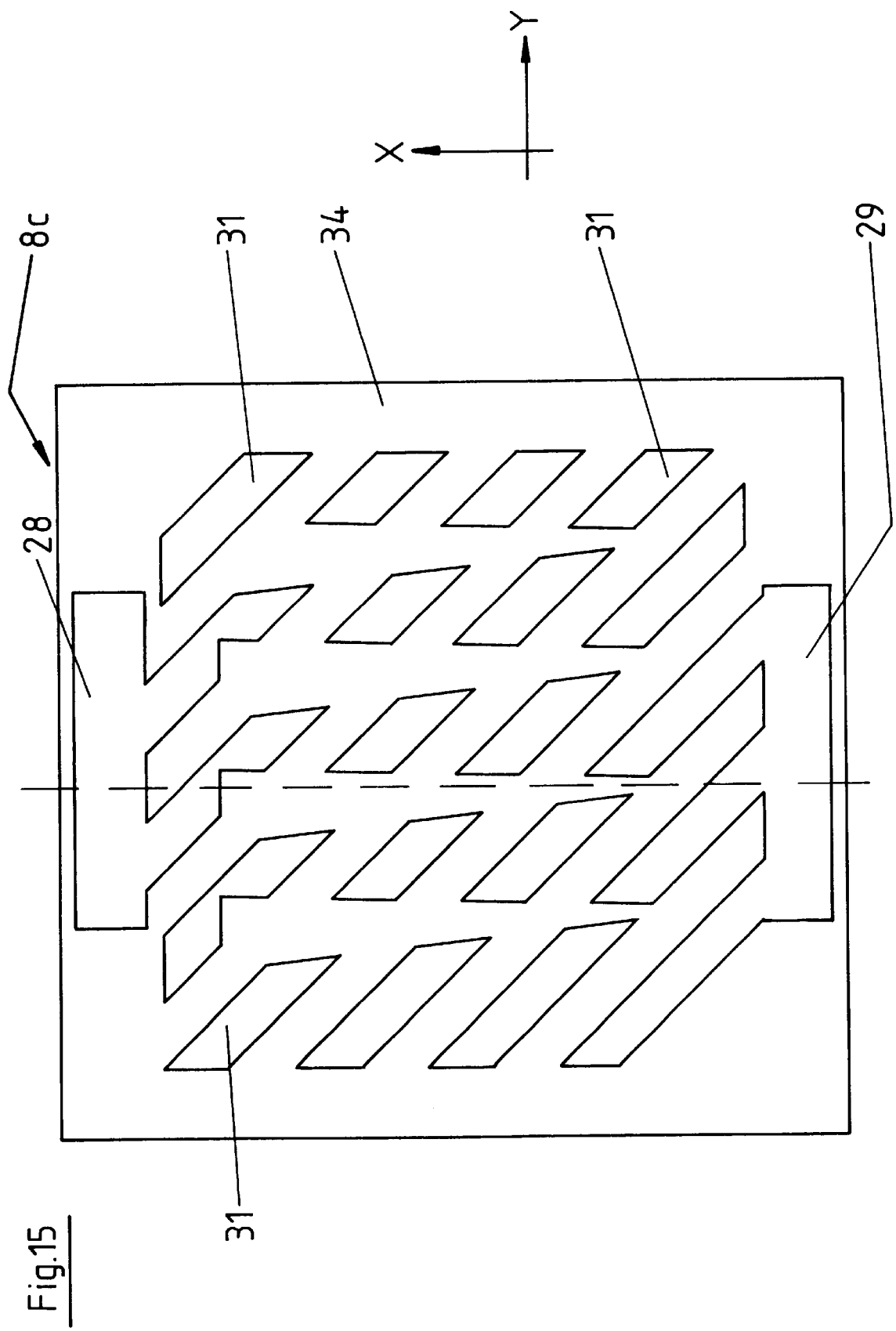

FIGS. 14 and 15 show the second metal layer 8c that together with the first metal layer 7c can be used for the manufacture of the cooler 1. In FIG. 14, however, the metal layer 8c is shown in the non-modified form and in FIG. 15 in the modified form. The structure of the latter is maintained by the fact that the non-modified metal layer 8c was mirrored on the mirror axis SA lying in the X-axis.

The structuring of the metal layer 8c can be described to the effect that in addition to the two openings 28 and 29, slotted openings 31 are provided for that enclose an acute angle with their long side with the longitudinal axis L or X-axis, for example an angle of 45°. The slotted openings 31 are at least partially interrupted between their respective ends and/or constricted in their width. The interruptions or constrictions are formed by wedge-shaped material stays or areas left in place during structuring, of which one is indicated in FIG. 14 with the dotted line 31'. These wedge-shaped material areas lie with their long side in the X-axis and widen in a mirror image to their longitudinal axis toward the side of the metal layer 8c provided with the opening 28.

Leaving the wedge-shaped material areas 31' in place results in these interrupting and or width-constricting material stays on the slotted openings 31, the width of which (stays) increases from the opening 29 to the opening 28, which also causes the flow resistance in the part of the cooler formed by the metal layers 8c to increase in the direction of flow from the opening 29 toward the opening 28. The wedge-shaped material areas 31' left in place also result in additional connecting stays in the structured metal layers 8c, which increases their mechanical strength. Additionally, the material areas 31' left in place are formed and arranged e.g. symmetrically to a middle axis extending in the X-axis, so that with alternating superimposed non-modified and modified metal layers 8c the wedge-shaped material areas 31' of these interconnected metal layers 8c form wedge-shaped posts.

For the manufacture of the cooler 1, the metal layers 7c and also the metal layers 8c are superimposed in a stack in such a way that a non-modified metal layer 7c or 8c is adjacent to a modified metal layer 7c or 8c and all openings 28, and also all openings 29 are superimposed congruently and the openings 29 and the openings 28 form the chamber 10 and the chamber 11, respectively. By use of modified and non-modified metal layers 7c and 8c the slotted openings 30 or 31 intersect each other, so that passages extending in the direction of the Y-axis are formed at the intersections. By means of the structuring of the metal layer 8c described above, a reduction of the flow diameter and therefore an increase in the specific flow resistance between chambers 10 and 11 in the area containing the metal layers 8c and therefore an improved lateral distribution of the coolant is achieved. While flowing through the cooler structure between the chambers 10 and 11, this coolant is increasingly displaced to the outer end layer 5 forming the top of the cooler, whereby at the same time the coolant also continues to flow in the lower area of the cooler 1.

Of course, the openings 31 for increasing the specific flow resistance can be constructed differently than shown in FIGS. 14 and 15. It is possible, for example, that at least some of the openings 31 have a wedge-shaped or step-shaped decreasing opening. Of course it is also possible that instead of the metal layers 8c other metal layers can be used that are structured in such a way as to result in an increase in the specific flow resistance or decrease in the effective flow diameter in the direction of flow.

Figure 16:
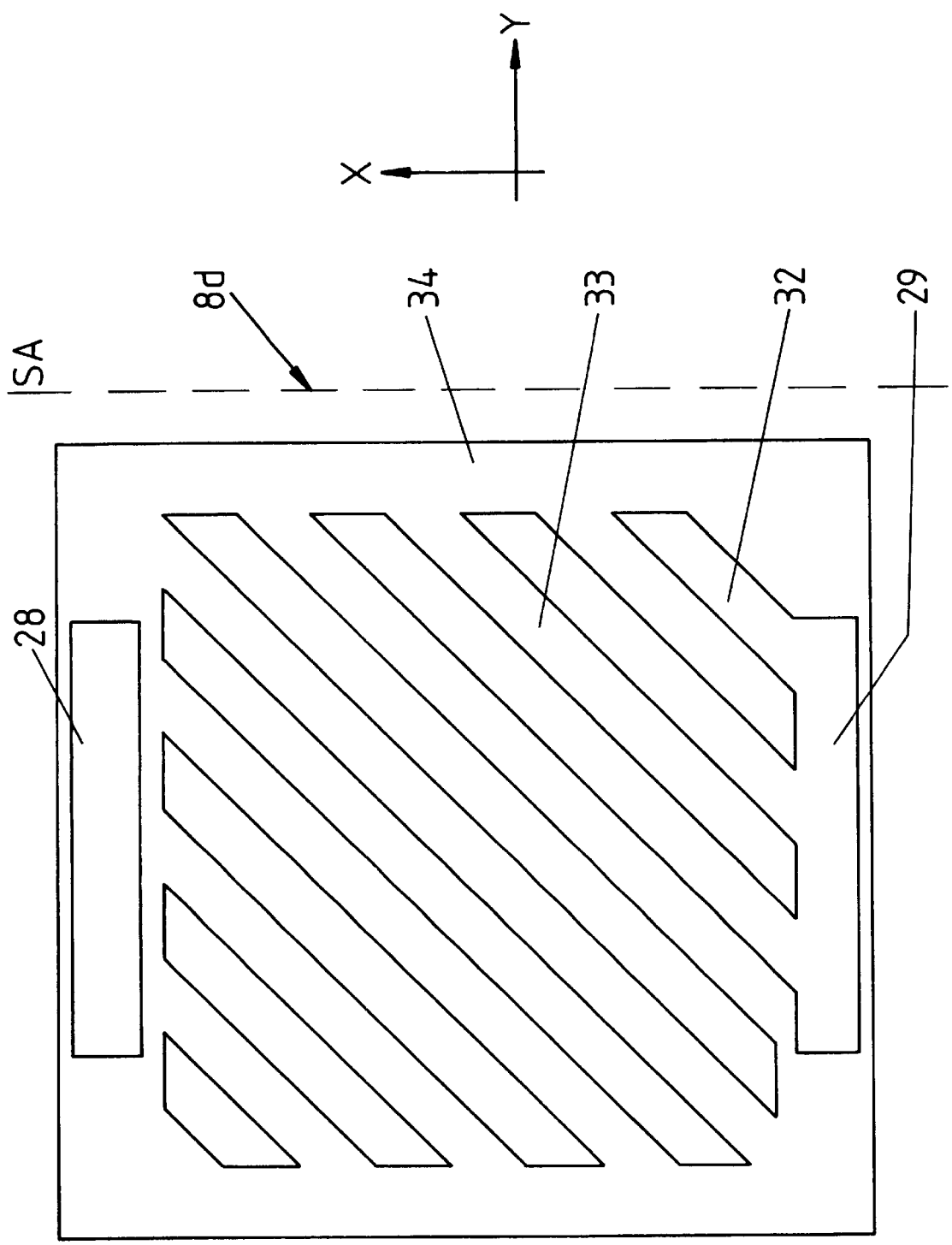
FIG. 16 and FIG. 17 illustrate in simplified depiction and in top view, second structured metal layers for a further possible embodiment of a micro cooler.
Figure 17:
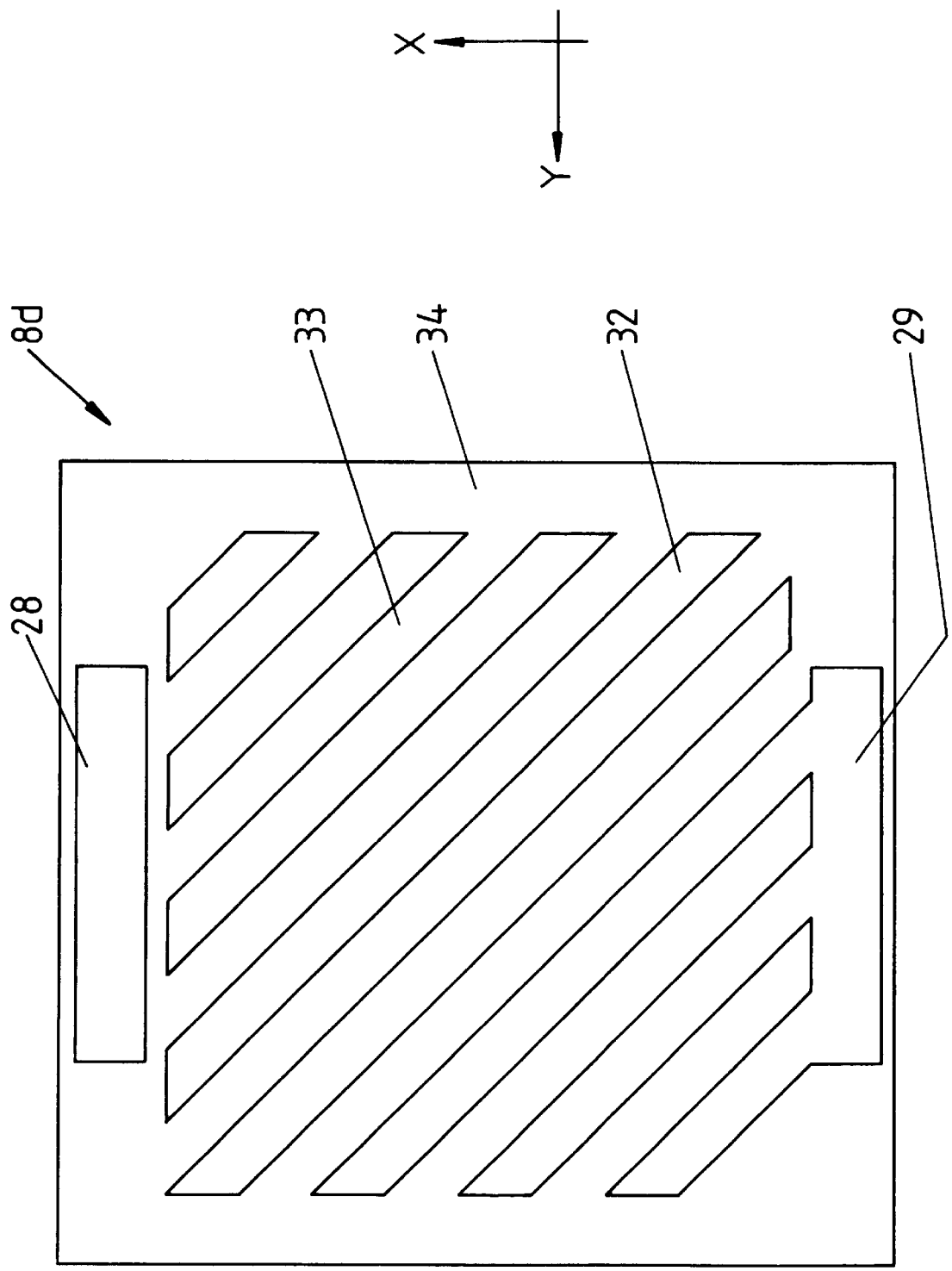

FIGS. 16 and 17 show a metal layer 8d in non-modified form (FIG. 16) and in modified form (FIG. 17) that can be used instead of the metal layer 8c or together with this in connection with the metal layer 7c of FIGS. 12 and 13.

The metal layer 8d differs essentially in its structure from the metal layer 8c only in that slotted openings 31 are provided for, that in the depicted embodiment correspond to the openings 30 of the metal layer 7c, however of such a construction that none of the openings 32 extends into the opening 28, so that a barrier for the coolant is formed in the flow direction before reaching the channel formed by the openings 28 in the area of the cooler structure formed by the metal layers 8d, in which, of course, modified and non-modified metal layers 8d alternate, through which (barrier) this coolant is deflected to the top of the cooler 1 forming the cooling surface.

In the depiction in FIGS. 12–17 it was assumed that none of the slotted openings 30, 31 or 32 extend with both ends into the openings 28 and 29. This ensures that the material stays, designated in these figures as 33, that are formed between the openings 30–32 are mechanically connected with the other, closed areas of the respective metal layer, especially with the edge area 34 that is closed all the way around. With appropriate structuring, however, for example by using bridges etc., at least some of the slotted openings can also extend into both openings 28 and 29.

Figure 18:
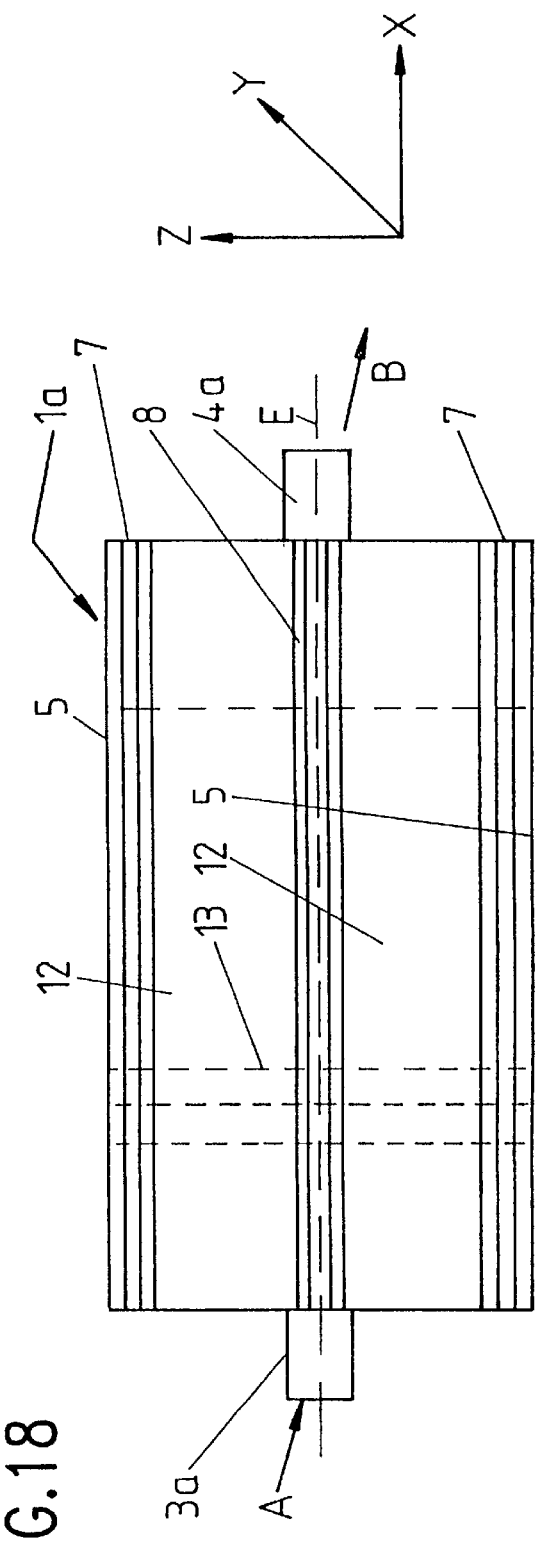
FIG. 18 illustrates in simplified depiction and in side view, a micro cooler constructed symmetrically on a middle axis.

In the description in FIG. 1 it was assumed that the cooler 1 serves to accommodate components 2 to be cooled only on its top. FIG. 18 shows a cooler 1a that differs essentially from cooler 1 in that the plane 3 is the middle plane of the cooler 1a, that manufactured areas of the cooler structure are formed with increasing flow resistance on both sides of this plane E first using the second metal layers 8 and then the outer areas using the metal layers 7, so that a control of the lateral distribution symmetrical to plane E takes place. The cooler 1a is closed with a respective outer end layer above and below. The supply and removal of the coolant take place by means of a connection or intake 3a and outlet 4a, that are provided for on the two opposite faces of the cooler 1a, in the depicted embodiment with their axes lying in the plane E.

Although for the sake of clarity in FIG. 18 only the metal layers 5 and between these only some of the metal layers 7 and 8 are shown, the cooler 1a of course consists only of such metal layers arranged superimposed in a stack and connected on the surface with each other, i.e. there are further metal layers 7 and 8 between the layers 7 and 8 shown by way of example.

Figure 19:
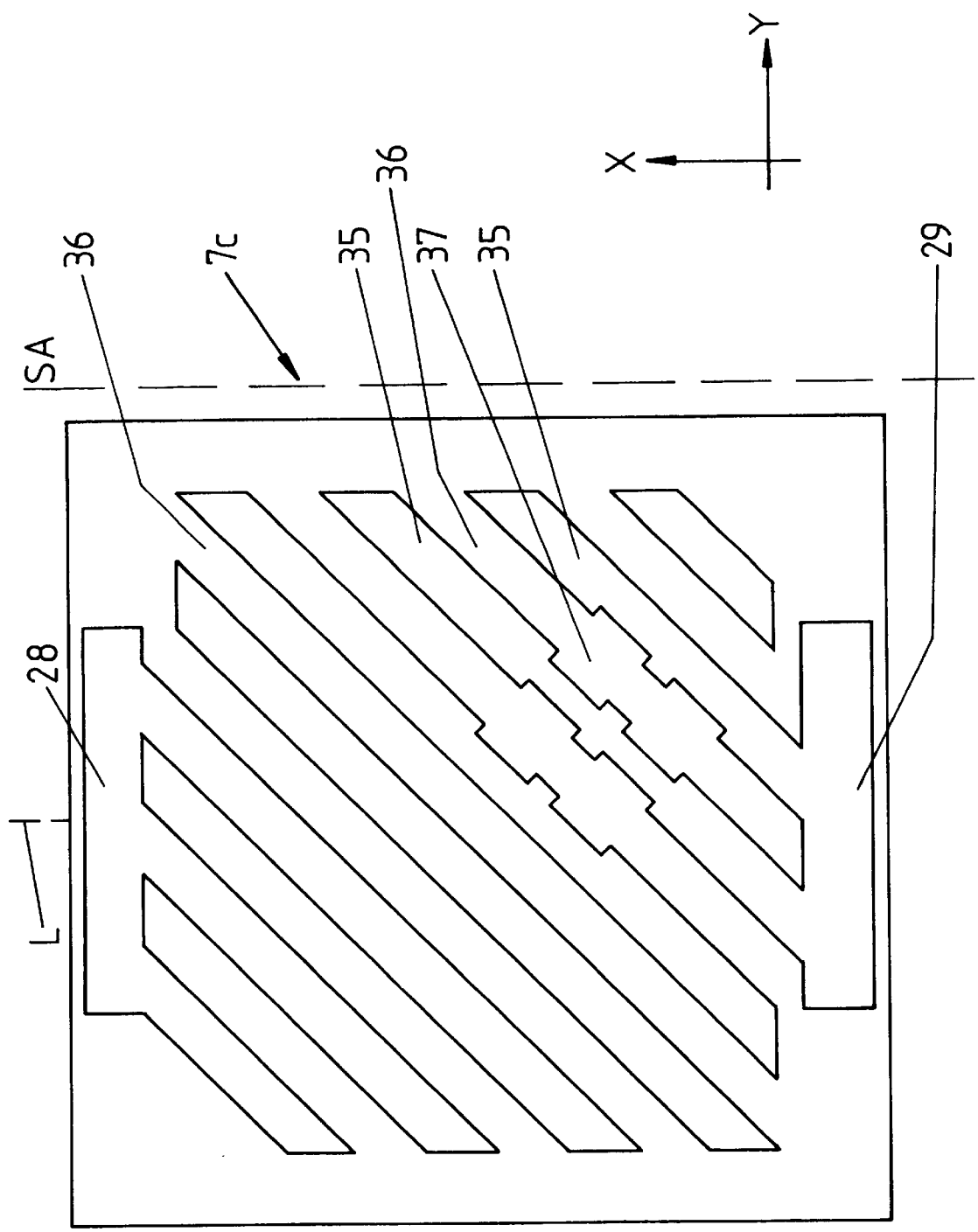
FIG. 19 illustrates a top view of a structured metal layer of a micro cooler formed by structures crossing each other.

FIG. 19 shows a metal layer 7e whose structure is very similar to the structure of the metal layer 7c (FIG. 12), i.e. the metal layer 7e has on both sides of the square metal layer 7e extending in the Y-axis the rectangular openings 28 and 29 that lie in the Y-axis with their long side and that are at a distance from each other in the X-axis. The metal layer 7e also has the slotted openings 35 that enclose an angle smaller than 90° with their long side, for example an angle of 45° with the middle longitudinal axis L of the metal layer 7e lying in the X-axis. The metal layer 7e differs from the metal layer 7c in its structure insofar as the material stays 36 formed between the openings 35 are enlarged in a specified grid at 37 and correspondingly the openings 35 are narrower in width. In the depicted embodiment the material stays 36 are square at the enlargements 37. The enlargements 37 are located where the material stays 36 cross, where a non-modified metal layer 7e and a modified metal layer 7e are superimposed., so that uninterrupted posts 13 are formed with an especially large diameter at the intersections in the cooler 1b (see also FIG. 20).

Figure 20:
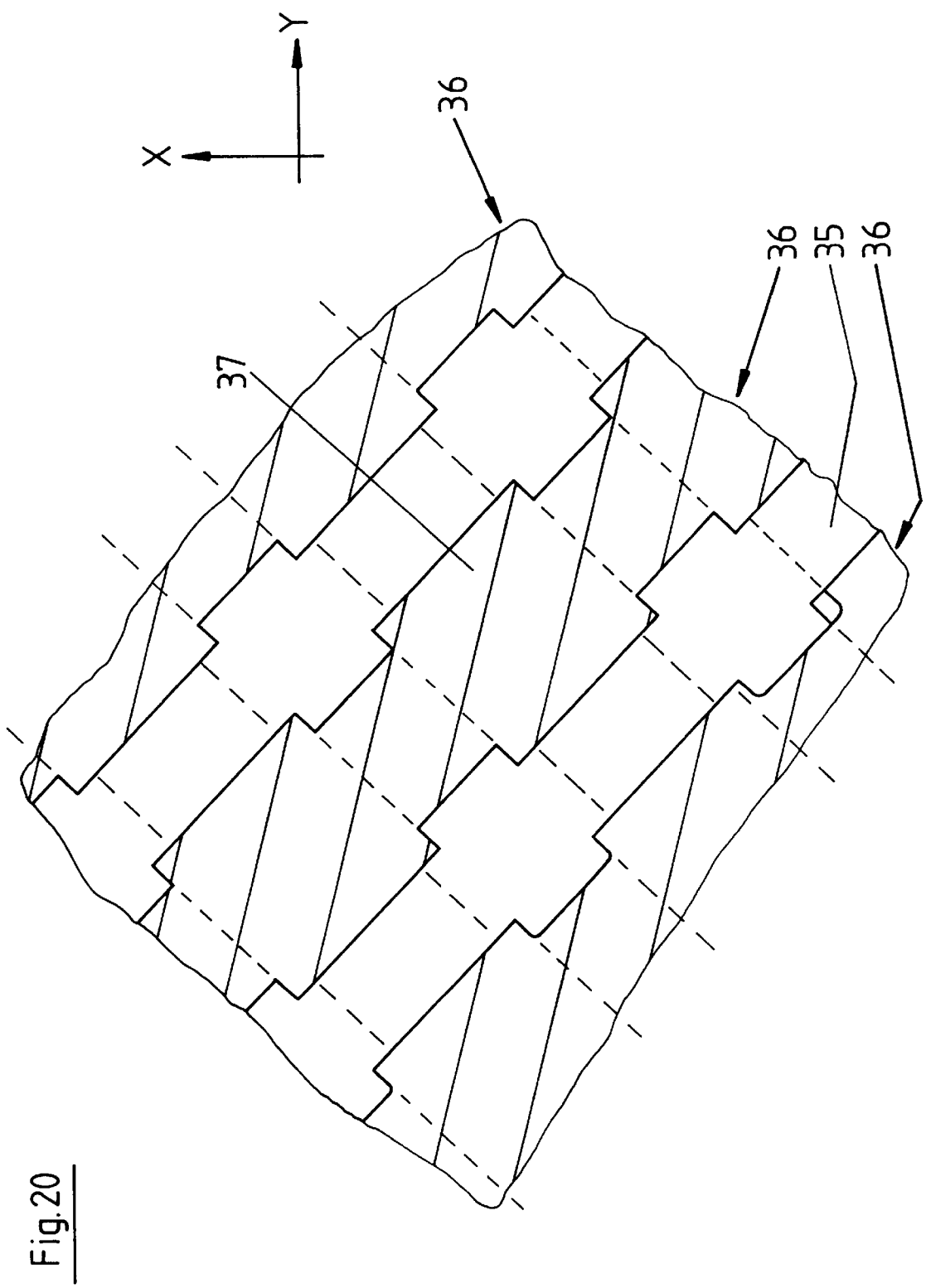
FIG. 20 illustrates in enlarged depiction, two crossed metal layers of FIG. 19.

For the square enlargements 37 depicted in FIGS. 19 and 20 the structure is, for example, as follows:
Width of the material stays 36 outside the enlargements 37:
0.05 to 0.5 mm, preferably 0.7 mm
Side lengths of the enlargements 37:
0.1 to 10 mm, preferably 1.4 mm
Axis clearance of two material stays 36:
0.15 to 15 mm, preferably 2.1 mm.

Other forms are also imaginable for the enlargements 37, for example ellipses, circles, rhombuses, drops etc. In the latter case the form of the enlargements is preferably such that the posts formed by these enlargements have a decreasing diameter in the direction of flow.

The metal layer 7e of FIG. 19 has a modified metal layer 7e that is obtained by mirroring the non-modified metal layer 7e of FIG. 19 at the mirror axis SA extending in the direction of the X-axis there.

Figure 21:
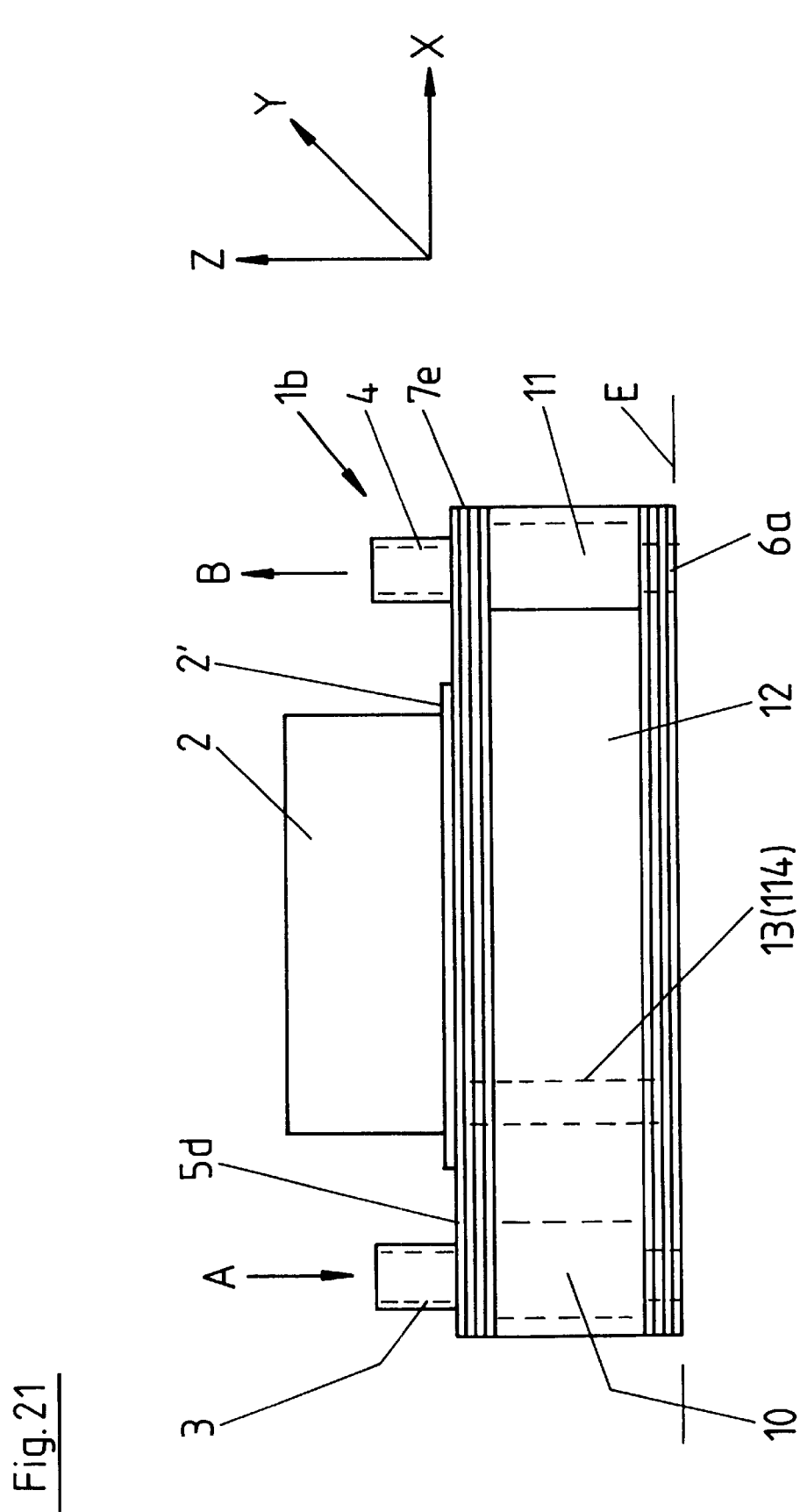
FIG. 21 illustrates in simplified depiction and in side view, a micro cooler.

FIG. 21 shows a cooler 1b that serves as a heat sink for removing dissipated heat (power dissipation) of an electric or electronic component or component group, for example a semiconductor power component or module. The electric or electronic component is designated in FIG. 21 as 2.

The cooler 1b is constructed of several layers, i.e. it consists of several cooler layers or metal layers, for example copper layers, that are arranged superimposed in a stack and are connected on the surface with each other, to the cooler 1 that is cube-shaped on the outer surfaces. In FIG. 21, an intake for the coolant, preferably for a liquid coolant, e.g. water, is also designated as 3. The outlet at which the coolant or the heat-transferring medium leaves the cooler 1b is designated as 4.

In particular, the metal layers form an upper end layer 5 and a lower end layer 6. The upper end layer 5 is uninterrupted, i.e. not structured. The lower end layer 6 has openings for the connections 3 and 4.

Between these outer metal layers 5 and 6 there are structured metal layers in the interior of the cooler that are connected to each other in a stack. The structured metal layers are the metal layers 7e described above, whereby again modified and non-modified metal layers 7e connect to each other. The congruent openings 29 and the likewise congruent openings 29a of the metal layers 7e form the chambers 10 and 11 for this cooler. All metal layers 5, 6 and 7e lie with their upper sides in the X-Y plane for the representation chosen for FIG. 21. In the Z-plane the metal layers follow one another in a stack in such a way that a modified metal layer 7e is always adjacent to a structured metal layer 7e. The metal layers 5, 6 and 7e are connected to each other by means of the DCB technique.

During operation the coolant supplied by the intake 3 flows through the interior of the cooler 1b through a networked canal system formed by the structuring of the metal layers 7e. The intake 3 and outlet 4 are offset to each other in the direction of the X-axis in the representation chosen for FIG. 21.

Figure 22:
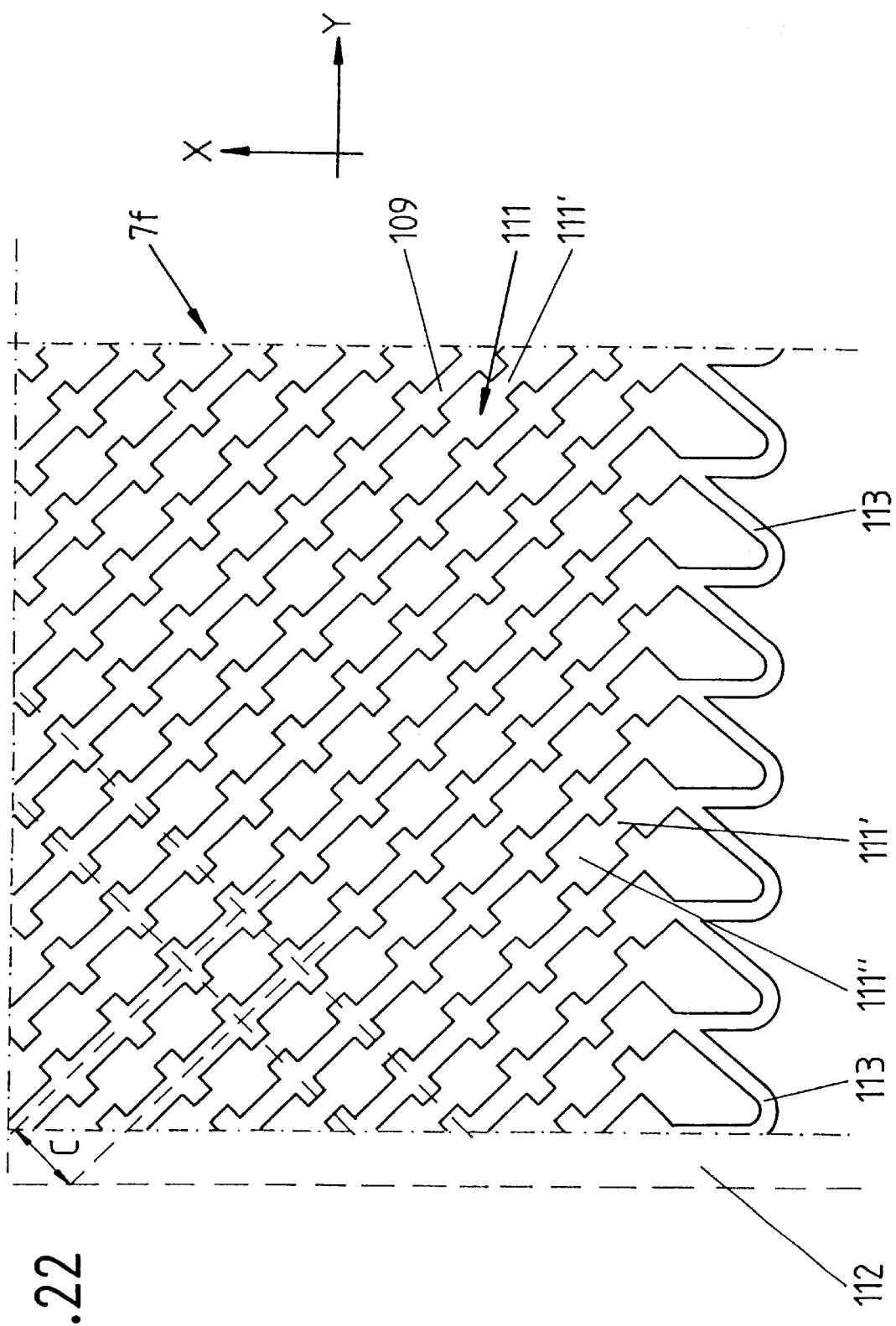
FIG. 22 and FIG. 23, both in top view, illustrate a structured first metal layer (FIG. 22) or a structured second metal layer (FIG. 23) for use with a cooler of FIG. 21.
Figure 23:
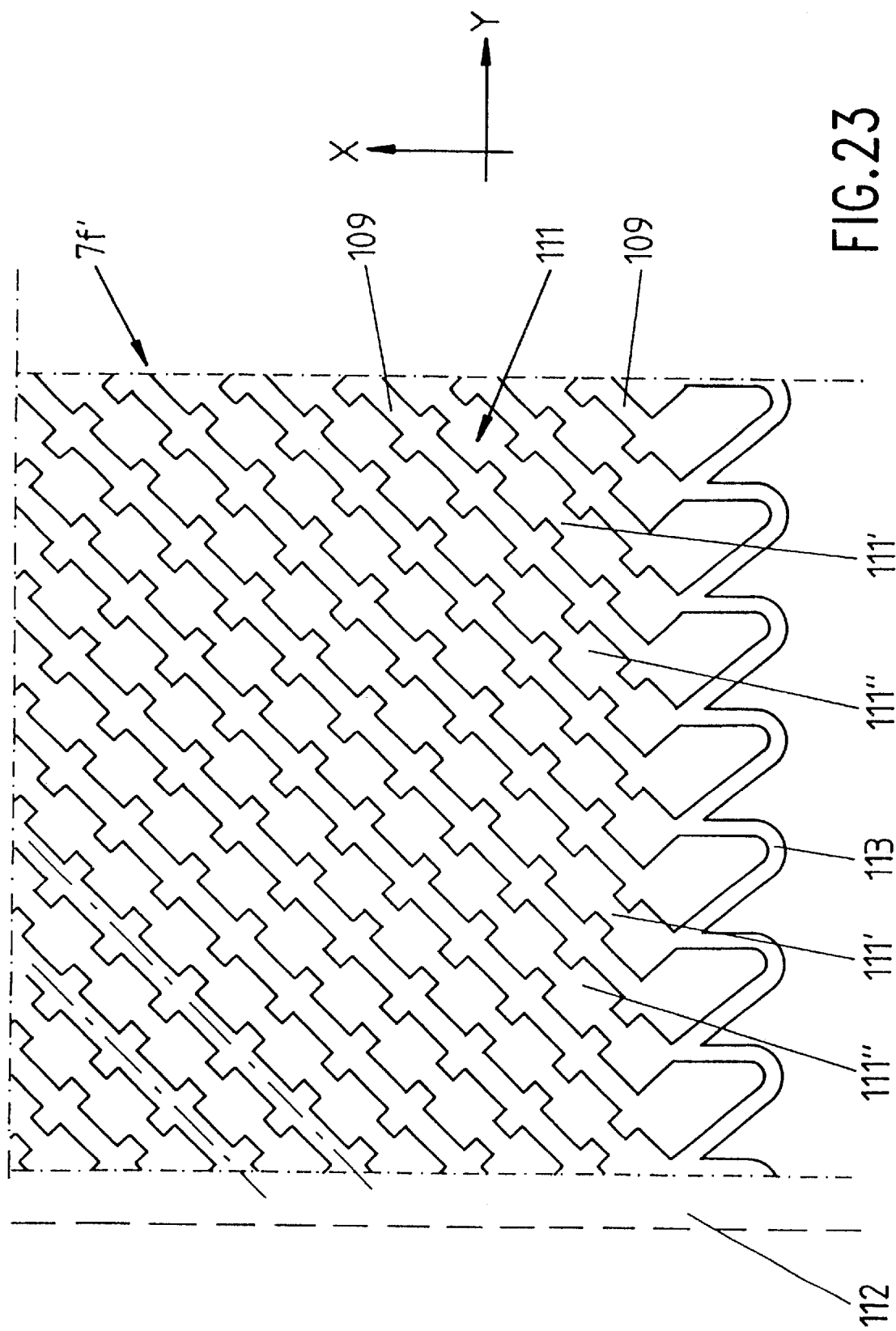
Figure 27:
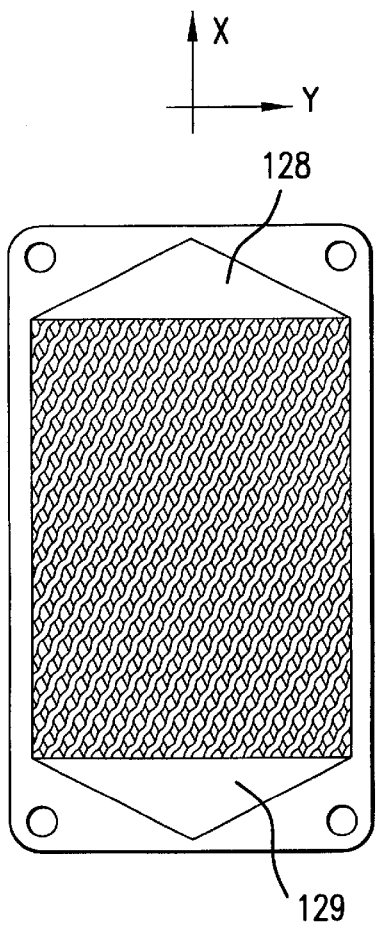
FIG. 27 and FIG. 28 illustrate in simplified depiction and in top view, a first and a second structured metal layer of a further possible embodiment of a micro cooler.
Figure 28:
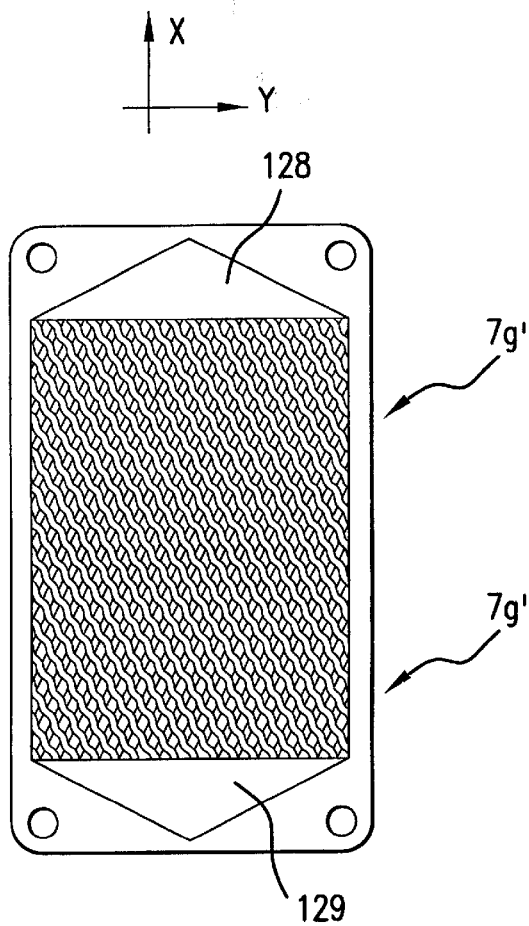
Figure 30:
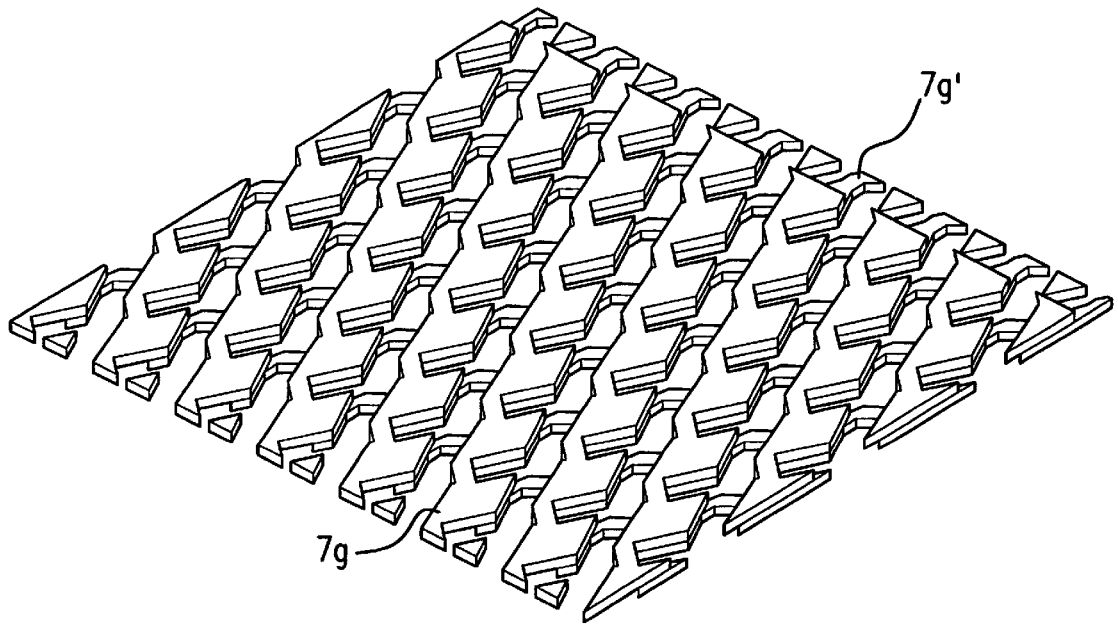
FIG. 30 illustrates in enlarged partial view, a first and a second metal layer arranged superimposed of FIGS. 27 and 28.
Figure 29:
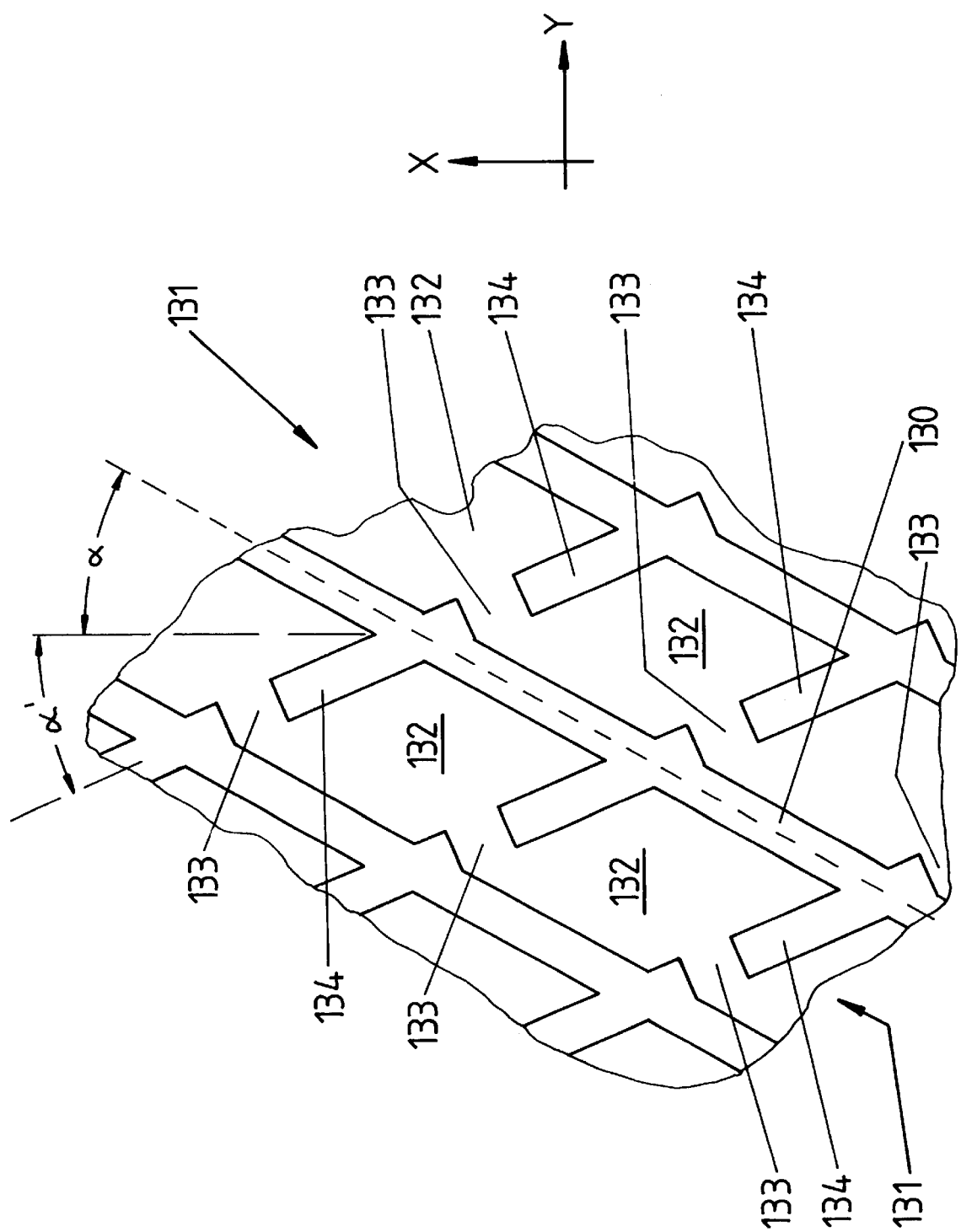
FIG. 29 illustrates in enlarged partial view, one of the metal layers of FIGS. 27 and 28.

FIGS. 22 and 23 show as a further construction metal layers 7f and 7f', of which the metal layer 7f' is the modified form of the metal layer 7f and which can be used instead of the metal layers 7e with the cooler 1b.

This structuring of the metal layer 7f is formed in that a number of slots 109 are made into the metal of the metal layers 7f that lie in the axis C with their long side and enclose an angle of 45° with the X-axis. All slots 109 lie parallel to one another and adjacent slots 109 have the same axial clearance c from each other.

The slots 109 are provided with lateral notches 110 at regular intervals, of a type that these notches 110 are formed in pairs across from one another on the two long sides of each slot. The notches 110 of each pair of notches lie on a common axis D, on which also notches 110 of adjacent slots 109 are provided for, i.e. all notches 110 are on the axes D, which extend parallel to one another and are at a distance d from each other. In the depicted embodiment the axes C and D intersect each other at right angles. The distance c is the same as the distance d. The width of the notches 110 vertical to the respective axis D is the same as the width of the slot 109.

Furthermore, the structuring is such that between the individual slots 109 and also between each notch 110 of a slot 109 and the notch 110 of an adjacent slot there are material stays 111 remaining. These material stays 111 are mechanically connected with each other also in the area of the intake 3 and the outlet 4 and with an edge area 112 surrounding the structured area of the metal layer 7f and forming a closed frame, in the area of the intake 3 and the outlet 4 by means of curved material stays 113.

FIG. 23 shows the structuring of the modified metal layers 7f'. These correspond to the structuring of the metal layer 7f, however in modified form, in such a way that the longitudinal slots 109 of the metal layer 7*f* are arranged with their long side in the axis direction D and the notches 110 on the axes C, in such a way that with alternating metal layers 7*f* and 7*f'* arranged superimposed in the cooler 1*b*, not only the longitudinal slots 109 of adjacent metal layers intersect each other, but that each longitudinal slot 109 of a metal layer lies directly adjacent to a row of notches 110 of the adjacent metal layer extending vertically to this longitudinal slot. This results in enlarged passages between the intersecting longitudinal slots 109 of adjacent metal layers at the intersections of the longitudinal slots 109 of adjacent metal layers through the notches 110, as shown clearly in FIG. 24, one enlargement through four intended notches 110 of the two metal layers at the intersections, whereby each notch 110 of a metal layer forms an enlargement ending in the longitudinal slot 109 of the adjacent metal layer. Through the areas 111' of the material stays 111 remaining between the notches 110 of adjacent slots 109, a change in the direction of flow of the heat-transferring medium for example from the direction of the axis C in the direction of the axis D or vice versa is only possible in that the heat-transferring medium from the longitudinal slots 109 of the metal layer 7*f*, for example, enters the longitudinal slot 109 of the metal layer 7*f'*, etc.

The segments 111' of the stays 111 lying between adjacent longitudinal slots 109 and four notches 110 again form uninterrupted posts 114 in the cooler 1*b* that extend from the upper cooler layer 5 to the lower cooler layer 6 and despite the structuring of the cooler layers 7*f* and 7*f'* guarantee a high degree of stability for the cooler 1*b*.

FIG. 26 shows in a representation similar to FIG. 24 a further possible embodiment that differs from the embodiment of FIGS. 24 and 25 only in that the narrow stay segments 111' between two adjacent longitudinal slots 109 formed by the lateral enlargements or notches 110, which (stays) hold together the square stay segments 111" in the depicted embodiment, have a decreased material strength, as shown in FIG. 26 for the stay segment 111*a*' there. The material thickness at these narrow stay areas 111*a*' corresponds to only a fraction of the material thickness of the foil used for the metal layers, for example only about half the material thickness. In the depicted embodiment this is effected in that each stay segment 111*a*' is congruent with the surface side on one surface side of the respective metal layer and on the other surface side is set back from it. The stay segments 111*a*' with reduced material thickness are manufactured for example by etching, stamping or another suitable technique. Through the reduction of the material thickness at the stay areas 111*a*' a further reduction of the entire flow resistance for the coolant within the respective cooler is achieved. At the same time the stay segments 111" forming the posts 114 and around which the coolant flows are connected with each other and with the rest of the metal layers in the necessary manner.

FIGS. 27–30 show as a further possible embodiment structured metal layers 7*g* and 7*g*' for use in the cooler 1*b* depicted in FIG. 21, instead of the metal layers 7*e* there, for example. Of the two metal layers depicted in FIGS. 27 and 28, the metal layer 7*g*' is again the modified or inverted form of the metal layer 7*g*. In the cooler then, instead of the metal layers 7*e*, the metal layers 7*g* and 7*g*' are to be alternated. In FIGS. 27–30 the three spatial axes X, Y and Z are again indicated for the sake of clarity.

The metal layers 7*g* and 7*g*' again consist of a thin metal sheet, for example of a copper sheet or copper foil, whereby the structure of the metal layer 7*g* is formed in that this metal layer has the openings 128 and 129 on two opposite sides, which (openings) are also present in the metal layer 7*g*', so that with metal layers arranged superimposed the openings 128 of all metal layers and also the openings 129 of all metal layers lie congruently, causing the chambers 10 and 11 of the cooler to be formed. The openings 128 and 129 are offset in the longitudinal axis lying in the X-axis of the metal layers 7*g* and 7*g*'. Between these openings the metal layers 7*g* and 7*g*' are structured in such a way that they have a number of slots 130 that extend diagonally to the X-axis and enclose an angle α with this X-axis. Between these long slots 130 there are rows 131 of rhombus-shaped surface areas 132 that are connected by short, narrow material stays 133 to the respective row 131. Outside of the stays 133 the individual rhombus-shaped surface areas 132 are separated from each other by short slots 134 that extend diagonally to the long slots 130 and end in these. Several slots 134 lie in the same axis with each other and connect with each other by means of the material stays 133. The axes of the slots enclose an angle α with the X-axis that has the same value as the angle α, but is turned in opposition in relation to the X-axis.

The structure of the metal layer 7*g*' corresponds to the structure of the metal layer 7*g* and differs from this only in that the long slots 130 there enclose the angle α' with the X-axis, so that with the consecutive metal layers 7*g* and 7*g*' in the cooler, one slot of the metal layer 7*g* is always congruent with a series of slots 134 of the metal layer 7*g*'.

Furthermore, the surface areas 132 of the metal layers lie congruently superimposed in the cooler, whereby these surface areas 132 are connected with each other, for example by using the DCB technique. The congruently arranged surface areas 132 form uninterrupted columns in the cooler. Through the slots 130 and 134 and the stays 133 interrupting the slots a number of cooling channels branching out in all three spatial axes are formed between the chambers formed by the openings 128 and 129, which (cooling channels) ensure intensive circulation by the heat-transferring medium, especially of the columns formed by the surface areas 132.

Through the rhombus-shaped structure of the surface areas 132 and therefore through the rhombus-shaped structure of the columns a low flow resistance is achieved with an optimal heat exchange effect between the heat-transferring medium and the metal layers. The possibility exists to reduce the material of the metal layers 7*g* and/or 7*g*' in the area of the stays 133.

The invention was described above using an example embodiment. Of course, alterations or adaptations are possible without abandoning the inventive idea on which the invention is based.

REFERENCE LIST 1, 1*a*, 1*b* cooler
2 electronic or electrical component
2' insulating layer
3, 3' coolant intake
4, 4' coolant outlet
5, 6, 5*d*, 6*d* metal end layer
7, 7*a*, 7*b* metal layer
7*c*, 7*e* metal layer
8, 8*a*, 8*b*, 8*c*, 8*d* metal layer
9 line
10, 11 chamber
12 micro-cooler structure
13 post
14 closed border area
15, 15', 15" structured area
16 opening 17 stay
18 island
19', 19" opening
20 structured area
21 opening
22 stay
23 opening
24 stay
25, 27 opening
28–32 opening
33 material stay
34 closed border
35 opening
36 material stay
37 enlargement
109 uninterrupted longitudinal slots
110 lateral enlargements or notches
111 material stays
111', 111" areas
112 closed border
113 material stays
114 posts
128, 129 openings
130 slot
131 row
132 surface area
133 stay
slot
A, B direction of flow
C, D axis
c, D axial clearance
X-axis
Y-axis
Z-axis

What is claimed is:

1. A cooler for using as a heat sink for electrical or electronic components such as component elements, electronic circuits, modules, where the cooler forms at least one cooling surface for the electrical or electronic components and comprises a plurality of cooler layers arranged in a stack and connected to each other on a surface, said layers being structured by providing with a number of openings or passages to form a cooler structure with at least a two dimensional branching flow routes for a coolant in at least two spatial axes (X-axis; Y-axis, Z-axis) in an interior of the cooler between at least one intake and at least one outlet for the coolant, at least part of the plurality of cooler layers forming the cooler structure being structured in such a way, that ratio of the surface area occupied by the openings or passages to the surface area not occupied by the openings or passages decreases in a direction from the intake to the outlet such, that within the cooler structure a flow resistance between areas of cooler structure located closer to said at least one cooling surface and areas of cooler structure located further away from said at least one cooling surface increases respectively from the at least one intake toward the at least one outlet.

2. The cooler according to claim 1, wherein at least part of the plurality of cooler layers are structured so that the flow resistance between the areas of cooler structure located closer to the at least one of the cooling surfaces and areas of cooler structure located further away from the cooling surface increases continuously or in several stages from the at least one intake toward the at least one outlet, respectively.

3. The cooler according to claim 1, wherein at least part of the plurality of cooler layers are structured in such a way, that the gradient of flow resistance between the areas of cooler structure located closer to the at least one of the cooling surfaces and areas of cooler structure located further away from the cooling surface increases continuously or in several stages from the at least one intake toward the at least one outlet, respectively.

4. The cooler according to claim 1, wherein the flow resistance for the coolant in the areas of the cooler structure located closer to said at least one of the cooling surfaces is constant from the at least one intake toward the at least one outlet.

5. The cooler according to claim 1, wherein at least one first area of the cooler structure to said at least one cooling surface is formed by at least one first cooler layer which is structured for providing a constant flow resistance for the coolant in the direction of the intake toward the outlet.

6. The cooler according to claim 5, wherein at least one second area is formed by at least one second cooling layer to the at least one first area of the cooler structure and separate from the at least one cooling surface, said at least one second cooling layer having a structure such that the specific flow resistance for the coolant increases from the intake toward the outlet.

7. The cooler according to claim 1, wherein that the cooler layers are structured in such a way that the passages or openings of adjacent cooler layers are only partially congruent, so that continually branching flow routes for the coolant result at least in the cooler structure between the individual cooler layers in two axis directions running vertical to one another, or in three axis directions running vertical to one another (X-axis, Y-axis, Z-axis).

8. The cooler according to claim 1, wherein the cooler structure is between at least one first chamber formed by openings in the cooler layers and serving to supply the coolant and a second chamber formed by openings in the cooler layers and serving to drain off the coolant.

9. The cooler according to claim 1, wherein at least one of the cooler layers are provided with a number of sieve-like openings and material surfaces surrounding these openings.

10. The cooler according to claim 1, wherein the passages or openings form a net-like structure, in which the passages or openings are surrounded by polygon or ring structures formed by stays.

11. The cooler according to claim 6, wherein the second cooler layers have passages or openings decreasing in diameter toward the outlet.

12. The cooler according to claim 6, wherein the at least one second cooler layer is formed in such a way that openings or passages of the at least one second cooler layer are at least partially closed by material stays increasing in width from the intake to the outlet.

13. The cooler according to claim 6, wherein the cooler layers are formed by slotted openings or passages that cross each other from one cooler layer to another and that the number or width of the slotted openings of the at least one second cooler layer is smaller than the corresponding number or width of the openings in the first cooler layer.

14. The cooler according to claim 1, wherein the cooler layers are formed by slotted openings or passages that cross each other from one cooler layer to the next, and that the openings in the second cooler layer become narrower toward the outlet.

15. The cooler according to claim 1, wherein at least the structured cooler layers are formed from metal layers.

16. The cooler according to claim 1, wherein with slotted structures or openings at least part of the structures or openings are enlarged at the intersections, in order to create passages with an enlarged diameter between the channels formed in the adjacent cooler layers.

17. The cooler according to claim 1, wherein the cooler layers are structured in such a way that surface areas of these cooler layers form uninterrupted posts extending vertically to the plane of the cooler layers.

18. The cooler according to claim 1, wherein on two opposite sides of the cooler there is at least one cooling surface, and wherein the cooling layers of the cooler structure between the cooling surfaces are structured such that the flow resistance for the coolant decreases from a plane (E) between the cooling surfaces toward each of the cooling surfaces respectively.

19. The cooler according to claim 6, wherein the second cooler layers have passages or openings decreasing in number toward the outlet.

20. The cooler according to claim 6, wherein the at least one second cooler layer is formed in such a way that openings or passages of the at least one second cooler layer are at least partially closed by material stays increasing in number from the intake to the outlet.

21. A cooler for using as a heat sink for electrical or electronic components such as component elements, electronic circuits, modules, where the cooler forms at least one cooling surface for the electrical or electronic components and comprises a plurality of cooler layers arranged in a stack and connected to each other on a surface, said layers being structured by providing with a number of openings of passages to form a cooler structure with at least a two dimensional branching flow routes for a coolant in at least two spatial axes (X-axis; Y-axis, Z-axis) in an interior of the cooler between at least one intake and at least one outlet for the coolant, at least part of the plurality of cooler layers forming the cooler structure being structured in such a way, that ratio of the surface area occupied by the openings or passages to the surface area not occupied by the openings or passages decreases in a direction from the intake to the outlet such, that within the cooler structure a gradient of a flow resistance between areas of cooler structure located closer to said at least one cooling surface and areas of cooler structure located further away from said at least one cooling surface increases respectively from the at least one intake toward the at least one outlet.

* * * * *